United States Patent
Ganzel

(10) Patent No.: US 6,206,484 B1
(45) Date of Patent: Mar. 27, 2001

(54) BRAKE SYSTEM HAVING A PILOT-OPERATED BOOST VALVE

(75) Inventor: Blaise J. Ganzel, Ann Arbor, MI (US)

(73) Assignee: Kelsey-Hayes Company, Livonia, MI (US)

( * ) Notice: Subject to any disclaimer, the term of this patent is extended or adjusted under 35 U.S.C. 154(b) by 0 days.

(21) Appl. No.: 09/330,652

(22) Filed: Jun. 11, 1999

Related U.S. Application Data

(63) Continuation of application No. PCT/US97/23687, filed on Dec. 19, 1997.
(60) Provisional application No. 60/033,690, filed on Dec. 19, 1996.

(51) Int. Cl.[7] .................................................. B60T 8/34
(52) U.S. Cl. ............................. 303/113.4; 303/116.2; 303/115.4; 303/119.2; 188/358
(58) Field of Search ........................... 303/113.2, 113.3, 303/113.4, 116.1, 119.2, 117.1, 113.1, 114.1, 115.1, 115.2, 115.4, 116.2, 119.1; 188/358, 355

(56) References Cited

U.S. PATENT DOCUMENTS

| | | | |
|---|---|---|---|
| 4,730,877 | * | 3/1988 | Seibert et al. ................ 188/358 |
| 4,902,075 | | 2/1990 | Uno et al. . |
| 4,938,541 | | 7/1990 | Shaw et al. . |
| 4,995,677 | | 2/1991 | Matsuda et al. . |
| 5,106,170 | | 4/1992 | Matsuda et al. . |
| 5,114,216 | * | 5/1992 | Tsuda et al. ................... 303/117.1 |
| 5,178,442 | * | 1/1993 | Toda et al. .................... 303/116.1 |
| 5,209,552 | * | 5/1993 | Reinartz et al. ................ 303/116.1 |
| 5,221,126 | | 6/1993 | Inoue . |
| 5,251,971 | * | 10/1993 | Reinartz et al. ................ 303/115.4 |
| 5,462,343 | * | 10/1995 | Yoshida et al. ................ 303/114.1 |
| 5,658,057 | | 8/1997 | Ohnuma et al. . |
| 5,667,285 | * | 9/1997 | Seetharaman et al. ........ 303/119.2 |
| 5,673,979 | * | 10/1997 | Kuromistu et al. ............ 303/116.1 |
| 5,884,985 | * | 3/1999 | Ganzel et al. .................. 303/113.2 |
| 5,941,608 | * | 8/1999 | Campau et al. ................ 303/113.4 |

* cited by examiner

Primary Examiner—Robert J. Oberleitner
Assistant Examiner—Thomas J. Williams
(74) Attorney, Agent, or Firm—MacMillan, Sobanski & Todd, LLC

(57) ABSTRACT

A vehicle brake system having a wheel brake and first and second conduits in fluid communication with the wheel brake. A master cylinder having an outlet is in fluid communication with the first conduit for supplying pressurized fluid to the first conduit. The brake system further includes an isolation valve movable between a first position, wherein fluid is permitted to flow from the master cylinder to the wheel brake via the first conduit, and a second position, wherein fluid is prevented from flowing from the master cylinder to the wheel brake via the first conduit. The isolation valve is preferably a pilot-operated valve movable between the first and second positions by a pressure differential between the outlet of the master cylinder and the pressure in the second conduit between the boost valve and the wheel brake. A source of pressurized fluid is in fluid communication with the wheel brake via the second conduit. A boost valve regulates the flow of fluid through the second conduit from the source of pressurized fluid to the wheel brake and is adapted to receive pressurized fluid from the first conduit for controlling the operation of the boost valve.

16 Claims, 17 Drawing Sheets

BRAKE SYSTEM HAVING A PILOT-OPERATED BOOST VALVE

CROSS REFERENCE TO RELATED APPLICATIONS

This application is a continuation of International Application No. PCT/US97/23687 filed Dec. 19, 1997, which claims priority to U.S. Provisional Patent Application No. 60/033,690 filed Dec. 19, 1996.

BACKGROUND OF THE INVENTION

This invention relates in general to a vehicle brake systems and in particular to a brake system having a pilot-operated boost valve located remotely from a master cylinder.

Vehicles are commonly slowed and stopped with hydraulic brake systems. These systems vary in complexity but a base brake system typically includes a brake pedal, a tandem master cylinder, fluid conduits arranged in two similar but separate brake circuits, and wheel brakes in each circuit. The driver of the vehicle operates a brake pedal which is connected to the master cylinder. When the brake pedal is depressed, the master cylinder generates hydraulic forces in both brake circuits by pressurizing brake fluid. The pressurized fluid travels through the fluid conduit in both circuits to actuate brake cylinders at the wheels to slow the vehicle.

Base brake systems typically use a brake booster which act during braking to provide a force to the master cylinder which assists the pedal force created by the driver. The booster can be vacuum or hydraulically operated. A typical hydraulic booster senses the movement of the brake pedal and generates pressurized fluid which is introduced into the master cylinder. The fluid from the booster assists the pedal force acting on the pistons of the master cylinder which generate pressurized fluid in the conduit in fluid communication with the wheel brakes. Thus, the pressures generated by the master cylinder are increased. Hydraulic boosters are commonly located adjacent the master cylinder piston and use a boost valve to control the pressurized fluid applied to the booster. Typically the boost valve is connected with the booster in the master cylinder assembly and mechanically coupled to the brake pedal for proper operation. Although this placement of the booster adjacent the master cylinder has been satisfactory in the past, it would be desirable to locate the booster remotely from the master cylinder because the tighter packaging constraints in the engine compartment of modern vehicles.

Braking a vehicle in a controlled manner under adverse conditions requires precise application of the brakes by the driver. Under these conditions, a driver can easily apply excessive braking pressure thus causing one or more wheels to lock, resulting in excessive slippage between the wheel and road surface. Such wheel lock-up conditions can lead to greater stopping distances and possible loss of directional control.

Advances in braking technology have led to the introduction of Anti-lock Braking Systems (ABS). An ABS system monitors wheel rotational behavior and selectively applies and relieves brake pressure in the corresponding wheel brakes in order to maintain the wheel speed within a selected slip range to achieve maximum braking force. While such systems are typically adapted to control the braking of each braked wheel of the vehicle, some systems have been developed for controlling the braking of only a portion of the plurality of braked wheels.

Electronically controlled ABS valves, comprising apply valves and dump valves, are located between the master cylinder and the wheel brakes. The ABS valves regulate the pressure between the master cylinder and the wheel brakes. Typically, when activated, these ABS valves operate in three pressure control modes: pressure apply, pressure dump and pressure hold. The apply valves allow pressurized brake fluid into respective ones of the wheel brakes to increase pressure during the apply mode, and the dump valves relieve brake fluid from their associated wheel brakes during the dump mode. Wheel brake pressure is held constant during the hold mode by closing both the apply valves and the dump valves.

To achieve maximum braking forces while maintaining vehicle stability, it is desirable to achieve optimum slip levels at the wheels of both the front and rear axles. During vehicle deceleration different braking forces are required at the front and rear axles to reach the desired slip levels. Therefore, the brake pressures should be proportioned between the front and rear brakes to achieve the highest braking forces at each axle. ABS systems with such ability, known as Dynamic Rear Proportioning (DRP) systems, use the ABS valves to separately control the braking pressures on the front and rear wheels to dynamically achieve optimum braking performance at the front and rear axles under the then current conditions.

A further development in braking technology has led to the introduction of Traction Control (TC) systems. Typically, valves have been added to existing ABS systems to provide a brake system which controls wheel speed during acceleration. Excessive wheel speed during vehicle acceleration leads to wheel slippage and a loss of traction. An electronic control system senses this condition and automatically applies braking pressure to the wheel cylinders of the slipping wheel to reduce the slippage and increase the traction available. In order to achieve optimal vehicle acceleration, pressurized brake fluid is made available to the wheel cylinders even if the master cylinder is not actuated by the driver.

During vehicle motion such as cornering, dynamic forces are generated which can reduce vehicle stability. A Vehicle Stability Control (VSC) brake system improves the stability of the vehicle by counteracting these forces through selective brake actuation. These forces and other vehicle parameters are detected by sensors which signal an electronic control unit. The electronic control unit automatically operates pressure control devices to regulate the amount of hydraulic pressure applied to specific individual wheel brakes. In order to achieve optimal vehicle stability, braking pressures greater than the master cylinder pressure must quickly be available at all times.

It would be desirable to provide a brake system having ABS, DRP, TC, and/or VSM systems which utilize a boost valve arrangement for packaging flexibility and a reduction in noise transmitted through the engine compartment to the interior of the vehicle.

SUMMARY OF THE INVENTION

This invention relates to an improved vehicle brake system. The vehicle brake system includes a brake pedal which actuates a hydraulic master cylinder. The master cylinder is selectively in fluid communication with a plurality of wheel brakes via fluid conduits and may provide pressurized fluid to the wheel brakes. A fluid pressure generator circuit is provided which preferably includes a pump and an accumulator. During normal operation, the fluid pressure generator circuit provides fluid at a relatively high pressure to the wheel brakes in place of the master cylinder during normal operation. A separate pilot-operated boost valve regulates the pressure from the source of pressurized fluid to the wheel brakes and maintains the pressure at pressure level which is greater than the pressure generated by the master cylinder by a predetermined multiple, which multiple is termed the "boost ratio". The brake system may include a pressure regulator valve for maintaining a fixed pressure drop across the boost valve. The brake system may also include a boost enable valve which helps prevent fluid leakage through the boost valve from the source of pressurized fluid to lower pressure portions of the brake system when the boost valve is commanded to be shut. During normal operation, the fluid from the master cylinder is diverted to a pedal travel simulator which provides an appropriate pedal feel for the operator of the vehicle in which the brake system is installed. The brake system may include a pilot-operated pedal travel simulator valve to divert the flow of fluid from the master cylinder to the pedal travel simulator. The pedal travel simulator valve shuttles between an open position and a closed position by referencing the pressure from the master cylinder and the boosted pressure.

Various objects and advantages of this invention will become apparent to those skilled in the art from the following detailed description of the preferred embodiments, when read in light of the accompanying drawings.

DETAILED DESCRIPTION OF THE PREFERRED EMBODIMENTS

Figure 1:
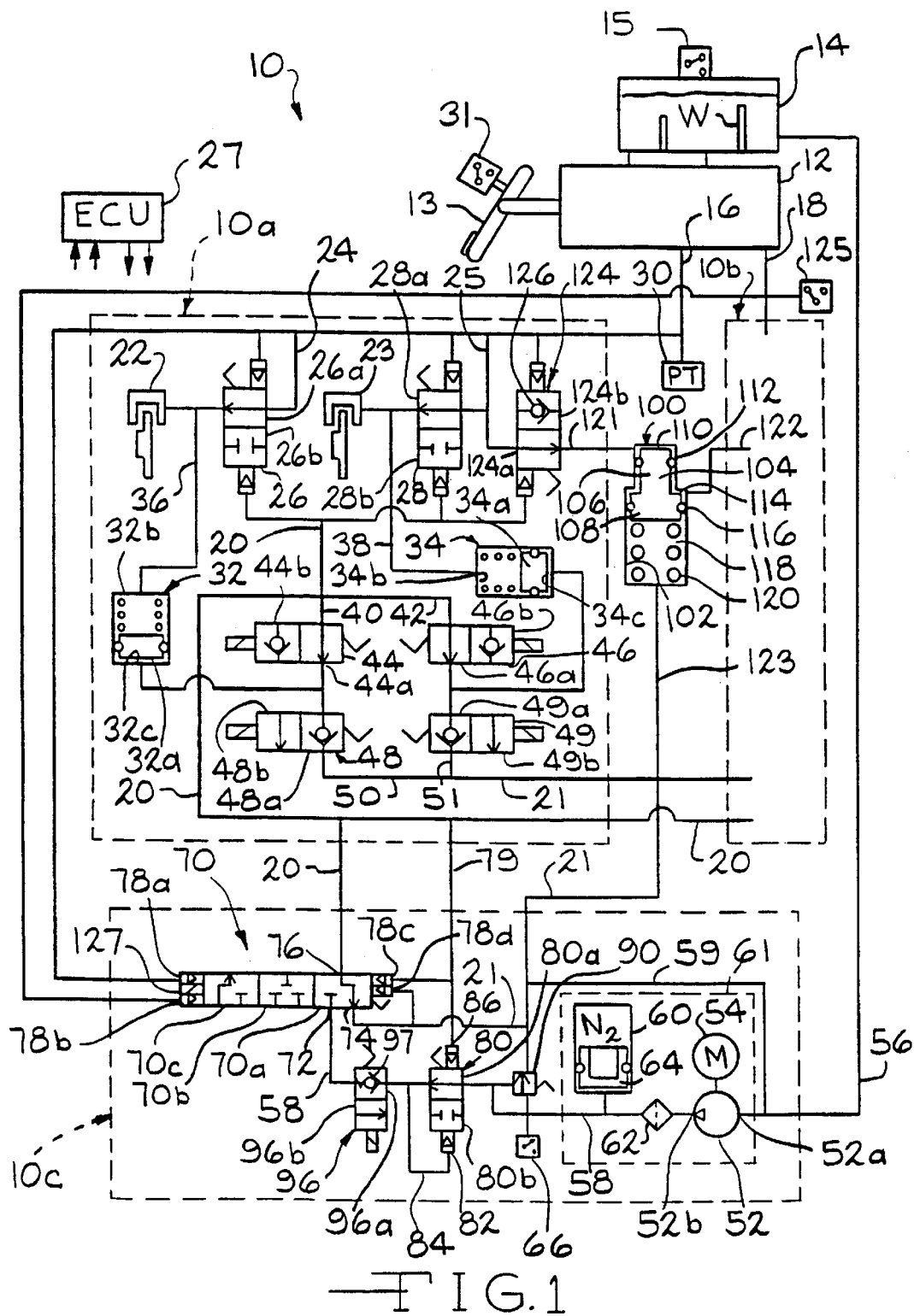
FIG. 1 is a hydraulic schematic of a first embodiment of a brake system in accordance with the present invention.

In the following description of the invention, certain terminology will be used for the purpose of reference only, and are not intended to be limiting. Terms such as "upper", "lower", "above", "below", "rightward", "leftward", "clockwise", and "counterclockwise" refer to directions in the drawings to which reference is made. Terms such as "inward" and "outward" refer to directions toward and away from, respectively, the geometric center of the component described. Terms such as "front", "rear", "side", "right-hand", "left-hand", "top", "bottom", "horizontal", and "vertical" describe the orientation of portions of the component within a consistent but arbitrary frame of reference which is made clear by reference to the text and the associated drawings describing the component under discussion. Such terminology will include the words specifically mentioned above, derivatives thereof, and words of similar import.

Referring now to the drawings, there is illustrated in FIG. 1 a hydraulic schematic of a first embodiment of a vehicle brake system, indicated generally at 10, in accordance with the present invention. The brake system 10 includes a master cylinder, such as a tandem master cylinder 12, which is operatively connected to a brake pedal 13. A fluid reservoir 14 is in fluid communication with the master cylinder 12 and holds a supply of brake fluid generally at atmospheric pressure. Throughout this specification and claims, the term "in fluid communication with" refers to a hydraulic connection between two or more components in which hydraulic pressure is transmittable from one component to another through a fluid medium. The components can be in direct fluid communication, wherein hydraulic fluid can directly flow between the components. Alternatively, the components can be indirectly in fluid communication, wherein fluid cannot flow directly between the components, but fluid pressure is transmittable between the components. For example, a fluid conduit extending between two components may include a movable piston slidably disposed therein such that the pressure of the fluid acting on one end of the piston causes the piston to move, thereby transmitting the pressure to the fluid acting on the other end of the piston.

A switch 15 may be connected to the reservoir 14 for sensing the fluid level within the reservoir 14. When the master cylinder 12 is actuated by the depression of the brake pedal 13, the pressurized brake fluid produced by the master cylinder 12 enters other portions of the brake system 10 from the master cylinder 12 via a pair of fluid conduits 16 and 18.

The brake system 10 generally includes three hydraulic brake circuits: a first brake circuit 10a, a second brake circuit 10b, and a fluid pressure generator circuit 10c. As will be discussed in detail below, the components within the first brake circuit 10a are similar in structure and operation to hydraulically isolated from the components in the second brake circuit 10b. For simplicity, generally only the components in the circuit 10a will be discussed. The master cylinder 12 is in fluid communication with the brake circuits 10a and 10b via the conduits 16 and 18, respectively. The fluid pressure generator circuit 10c is in fluid communication with each of the first and second brake circuits 10a and 10b via a supply fluid supply conduit 20 and a fluid return conduit 21. In normal operation, the fluid pressure generator circuit 10c provides pressurized fluid to the brake circuits 10a and 10b during normal braking to achieve brake boost and during ABS, TC, and VSC modes.

The first brake circuit 10a includes a pair of wheel brakes 22 and 23 in fluid communication with the master cylinder 12 via a pair of fluid conduits 24 and 25, respectively, which branch from the conduit 16. Similarly, the second brake circuit 10b includes a pair of wheel brakes (not shown) in fluid communication with the master cylinder 12 via the conduit 18. The brake system 10 can be configured as a diagonal split system, wherein the wheel brake 22 is associated with a non-driven wheel of the vehicle, the wheel brake 23 is associated with a driven wheel of the vehicle, and the wheel brakes of the second brake circuit 10b are similarly situated. Alternatively, the brake system 10 can be configured as a vertical split system, wherein the wheel brakes 22 and 23 are associated with wheels at opposite ends of the same axle. In a vertically split system, the wheel brakes 22 and 23 could be, for example, associated with driven wheels of the vehicle, and the wheel brakes of the second brake circuit 10b are associated with non-driven wheels.

Figure 17:
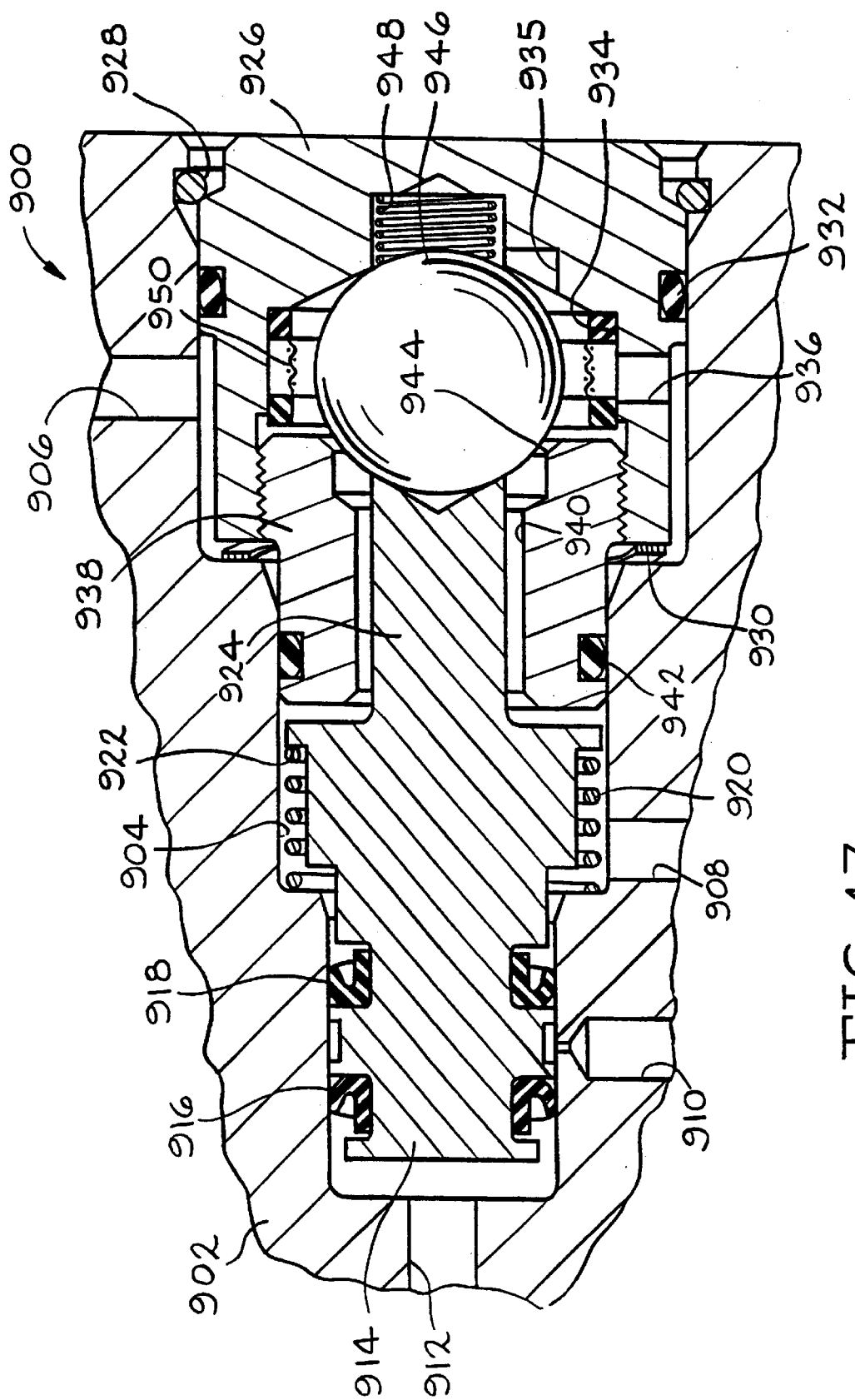
FIG. 17 is a sectional view of a first embodiment of a pedal travel simulator shut-off valve.

The brake circuit 10a includes a pair of isolation valves 26 and 28 which are located in the conduits 24 and 25, respectively, to regulate the flow of fluid between the respective wheel brakes 22 and 23 and the master cylinder 12. Preferably, the isolation valves 26 and 28 are normally open, pilot-operated 2-position, 2-way valves such that the position of the isolation valves 26 and 28 are regulated by the pressure differential between the conduit 16 from the master cylinder 12 and the supply conduit 20 from the fluid pressure generator circuit 10c. The isolation valves 26 and 28 have normally open positions 26a and 28a, respectively, and closed positions 26b and 28b, respectively. The isolation valves 26 and 28 provide for a "manual push through" to the wheel brakes 22 and 23, i.e., pressurized fluid from the master cylinder 12 can be sent to the wheel brake 22 and 23 when the isolation valves 26 and 28 are in their open positions 26a and 28a, respectively. Thus, the brake system 10 can operate even if an electrical power fault occurs. However, generally under normal boosted braking conditions, the isolation valves 26 and 28 are shuttled to their closed positions 26b and 28b, respectively, and the fluid pressure generator circuit 10c delivers pressurized fluid to the brake circuit 10a to actuate the wheel brakes 22 and 23, as will be discussed in detail below. Preferably, the brake circuit 10b is configured similarly. As described in detail below, there is illustrated in FIG. 17 a first embodiment of an isolation valve which can be used as the isolation valves 26 and 28.

The fluid pressure generator circuit 10c and various solenoid valves of the brake system 10 (further described below) are controlled by an electronic control unit 27 (ECU) using information from various sensors (not all shown). Preferably, the brake system 10 includes a pressure transducer 30 in fluid communication with the conduit 16 for transmitting pressure information to the ECU 27. Alternatively, the pressure transducer 30 may be located in the conduit 18. The brake system 10 may also include a brake switch 31 connected to the brake pedal 13 to provide a signal that the driver of the vehicle is depressing the brake pedal 13.

The brake circuit 10a further includes a pair of fluid separators 32 and 34 which fluidly isolate the master cylinder 12 from the fluid pressure generator circuit 10c. The fluid separators 32 and 34 include spring biased pistons 32a and 34a, respectively, which sealingly separates first chambers 32b and 34b from second chambers 32c and 34c, respectively. The pistons 32a and 34a are spring biased in a direction to expand the first chambers 32b and 34b, respectively. The first chambers 32b and 34b are in fluid communication with the wheel brakes 22 and 23 via fluid conduits 36 and 38, respectively. The second chambers 32c and 34c are in fluid communication with the supply conduit 20 from the fluid pressure generator circuit 10c via fluid conduits 40 and 42, respectively. The piston 32a in the fluid separator 32 is movable to permit pressure in the fluid pressure generator circuit 10c to act to pressurize fluid in the brake circuit 10a while preventing fluid interchange therebetween. Additionally, a rupture in the pressure generator circuit 10c will not result in fluid draining from the brake circuit 10a. The fluid separator 34 acts similarly to the fluid separator 32.

A pair of apply valves 44 and 46 are located in the conduits 40 and 42 to regulate the flow of fluid between the fluid pressure generator circuit 10c and the wheel brakes 22 and 23 via the fluid separators 32 and 34, respectively. Preferably, the apply valves 44 and 46 are normally open 2-position, 2-way solenoid operated valves. The apply valves 44 and 46 have normally open positions 44a and 46a, respectively, and one-way positions 44b and 46b, respectively. In the one-way positions 44b and 46b, the apply valves 44 and 46 restrict the flow of fluid in a direction from the fluid pressure generator circuit 10c to the fluid separators 32 and 34, respectively, but may permit the flow of fluid in the opposite direction.

The brake circuit 10a further includes a pair of dump valves 48 and 49. The dump valve 48 is located within a fluid conduit 50. The conduit 50 provides fluid communication between the apply valve 44 and the fluid separator 32 via the conduit 40 and the return conduit 21. The dump valve 49 is located within a fluid conduit 51. The fluid conduit 51 provides fluid communication between the apply valve 46 and the fluid separator 34 via the conduit 42 and the return conduit 21. The dump valves 48 and 49 regulate the flow of fluid between the fluid pressure generator circuit 10c and the reservoir 14, as will be explained in detail below. Preferably, the dump valves 48 and 49 are normally closed (one-way) 2-position, 2-way solenoid operated valves. The dump valves 48 and 49 have one-way positions 48a and 49a and open positions 48b and 49b, respectively. In the one-way positions 48a and 49a, the dump valves 48 and 49 prevent the flow of fluid in a direction from the fluid separators 32 and 34, respectively, to the reservoir 14 via the conduits 50 and 51, respectively, but permit the flow of fluid in the opposite direction.

The fluid pressure generator circuit 10c includes a pump 52 driven by a motor 54. The pump 52 has an inlet 52a in fluid communication with the reservoir 14 via a conduit 56, and an outlet 52b in fluid communication with a conduit 58. The conduit 56 is in fluid communication with the conduit 21 via a conduit 59. The pump 52 is operated to provide pressurized fluid. The pressurized fluid discharged from the pump 52 may be stored in a high pressure accumulator 60 which is in fluid communication with the conduit 58. Generally, the pump 52, the motor 54, and the high pressure accumulator 60 cooperate to provide a source of high pressure fluid, indicated generally by broken lines 61, for the fluid pressure generator circuit 10c. If desired, the conduit 58 may have a filter 62 therein positioned adjacent the outlet 52b of the pump 52. Preferably, the accumulator 60 has a piston 64 which is biased by a gas, such as nitrogen, to pressurize the fluid stored in the accumulator to suitable pressure levels. Of course, the accumulator 60 can be any suitable structure and any suitable storage pressure can be used. A pressure switch 66 is in fluid communication with the conduit 58 for sensing the pressure within the conduit 58. The pressure switch 66 generates a signal which is relayed to the ECU 27. The purpose of the signal from the pressure switch 66 will be explained below.

The fluid pressure generator circuit 10c further includes a boost valve 70. As will be discussed in detail below, the boost valve 70 is actuated by referencing the hydraulic pressures generated by the master cylinder 12, but is mechanically decoupled therefrom, i.e., the boost valve 70 is not mechanically connected to the master cylinder 12 or the brake pedal 13. Therefore, the boost valve 70 can be located remotely from the master cylinder 12, providing flexibility in positioning the boost valve 70 within the vehicle. Generally, the boost valve 70 is fluidly located between the output 52b of the pump 52 and the brake circuits 10a and 10b. The boost valve 70 provides selective boosted fluid pressure to the wheel brakes 22 and 23 as will be explained in detail below.

The boost valve 70 has a first port 72, a second port 74, and a third port 76. The first port 72 is generally in fluid communication with the outlet 52b of the pump 52 via the conduit 58. The second port 74 is in fluid communication with the inlet 52a of the pump 52 and the reservoir 14 via the conduits 21, 59, and 56. The third port 76 is in fluid communication with the second chambers 32c and 34c of the fluid separators 32 and 34, respectively, via the conduits 20, 40, and 42.

Preferably, the boost valve 70 is a 3-position, 3-way valve. The boost valve 70 can be any suitable valve configuration, such as a poppet valve or a spool valve. The boost valve 70 generally has three positions: a first position 70a, a second position 70b, and a third position 70c. When the boost valve 70 is in the first position 70a, the second port 74 is in fluid communication with the third port 76. In the second position 70b, the first, second, and third ports 72, 74, and 76 are separated and are not in fluid communication with each other. In the third position 70c, the first port 72 is in fluid communication with the third port 76.

The boost valve 70, as illustrated in FIG. 1, is pilot-operated by referencing the pressure at four control ports 78a, 78b, 78c, and 78d. The control port 78a is in fluid communication with the conduit 16. The control port 78b is in fluid communication with the conduit 18. The control port 78c is in fluid communication with the supply conduit 20 via the conduit 79 which branches from the supply conduit 20. The control port 78d is in fluid communication with the conduit 21. The boost valve 70 can also be solenoid operated for applying fluid pressure to the brake system 10 regardless of whether the driver of the vehicle is depressing the brake pedal 13, such as during TC or VSC braking operations. The operation of the boost valve 70 will be described in detail below.

The fluid pressure generator circuit 10c further includes a regulator valve 80. The regulator valve 80 is located in the conduit 58 and regulates the pressure of the fluid between the outlet 52b of the pump 52 and the first port 72 of the boost valve 70, as will be described in detail below. Preferably, the regulator valve 80 is a normally open 2-position, 2-way pilot-operated valve. The regulator valve 80 can be shuttled between an open position 80a and a closed position 80b by the fluid pressure differential between the conduits 58 and 20. The pressure in the conduit 58 is received at a control port 82 via a fluid conduit 84. The pressure in the supply conduit 20 is received at a control port 86 via the conduit 79. The control ports 82 and 86 are depicted in the hydraulic schematic of FIG. 1 to illustrate the pressure piloted properties of the regulator valve 80. The regulator valve 80 operates to maintain a predetermined pressure differential across the boost valve 70 by opening and closing the fluid path between the boost valve 70 and the source of pressurized fluid 61. For example, the regulator valve 80 can remain in the closed position 80b as long as the pressure in the conduit 58 is generally at a predetermined pressure level, such as for example, 100 p.s.i.g. (lb/in$^2$ gauge) above the pressure in the supply conduit 20, as sensed by the control ports 82 and 86. The regulator valve 80 shuttles to its open position 80a if the pressure differential between conduits 58 and 20 drops below the predetermined pressure level. The predetermined pressure level depends on various criteria including but not limited to the flow requirements of the boost valve 70 and the pressure necessary to overcome the friction produced by shuttling the regulator valve 80.

Preferably, the fluid pressure generator circuit 10c includes a pressure relief valve 90 in fluid communication between the conduits 58 and 59. The pressure relief valve 90 selectively hydraulically connects the conduit 59 to the conduit 58 between the pump 52 and the pressure regulator valve 80. The pressure relief valve 90 limits the output pressure of the pump 52 by opening at a predetermined pressure to create a closed loop return path between the outlet 52b of the pump 52 and the inlet 52a of the pump 52.

The fluid pressure generator circuit 10c further includes a boost enable valve 96 located in the conduit 58 between the boost valve 70 and the source of pressurized fluid 61. The boost enable valve 96 is movable between a one-way position 96a and an open position 96b. In the one-way position 96a, the boost enable valve 96 preferably has a low leakage, spring loaded one-way check valve 97. The check valve 97 prevents the flow of fluid from the first port 72 of the boost valve 70 to the source of pressurized fluid 61, but allows fluid to flow in the opposite direction when the pressure is above the cracking pressure of the check valve 97. The boost enable valve 96 helps prevent pressurized fluid from leaking through the boost valve 70 from the conduit 58 to the conduits 21, 59, and 56 back to the reservoir 14. The boost enable valve 96 can be a relatively is small solenoid valve assembly because the pressure regulator valve 80 regulates the pressure within the conduit 58 from the source of pressurized fluid 61 and maintains a relatively low pressure drop across the boost enable valve 96. The spring loaded one-way check valve 97 helps prevent the boost enable valve 96 from hydraulically locking in its one-way position 96a if the pressure regulator valve 80 should leak or the fluid in the conduit 58 heats up enough to cause a pressure increase between the regulator valve 80 and the boost enable valve 96.

The brake system 10 further includes a pedal travel simulator, indicated generally at 100. The pedal travel simulator 100 is an accumulator which receives brake fluid that is diverted by the isolation valves 26 and 28. Preferably, the pedal travel simulator 100 is designed so as to provide the driver with a pedal feel that is similar to typical hydraulic brake systems using conventional boosters. The pedal travel simulator 100 includes a stepped bore 102 having a stepped piston 104 disposed therein. The piston 104 has a smaller diameter, first portion 106 and a larger diameter, second portion 108. A first chamber 110 is generally defined by a portion of the bore 102, the first piston portion 106, and a first seal 112 seated about the first piston portion 106. A second chamber 114 is generally defined by a portion of the bore 102, the piston 104, the first seal 112, and a second seal 116 seated about the second piston portion 108. A third chamber 118 generally defined by a portion of the bore 102, the second piston portion 108, and the second seal 116. A spring 120 disposed in the third chamber 118 biases the stepped piston 104 towards the first and second chambers 110 and 114 to contract the volume of the first and second chambers 110 and 114. The first chamber 110 is in fluid communication with the conduit 16 via a conduit 121. The second chamber 114 is in fluid communication with the conduit 18 of the second brake circuit 10b via a conduit 122. The third chamber 118 is in fluid communication with the reservoir 14 via a conduit 123, and the conduits 21, 59, and 56.

Figure 16:
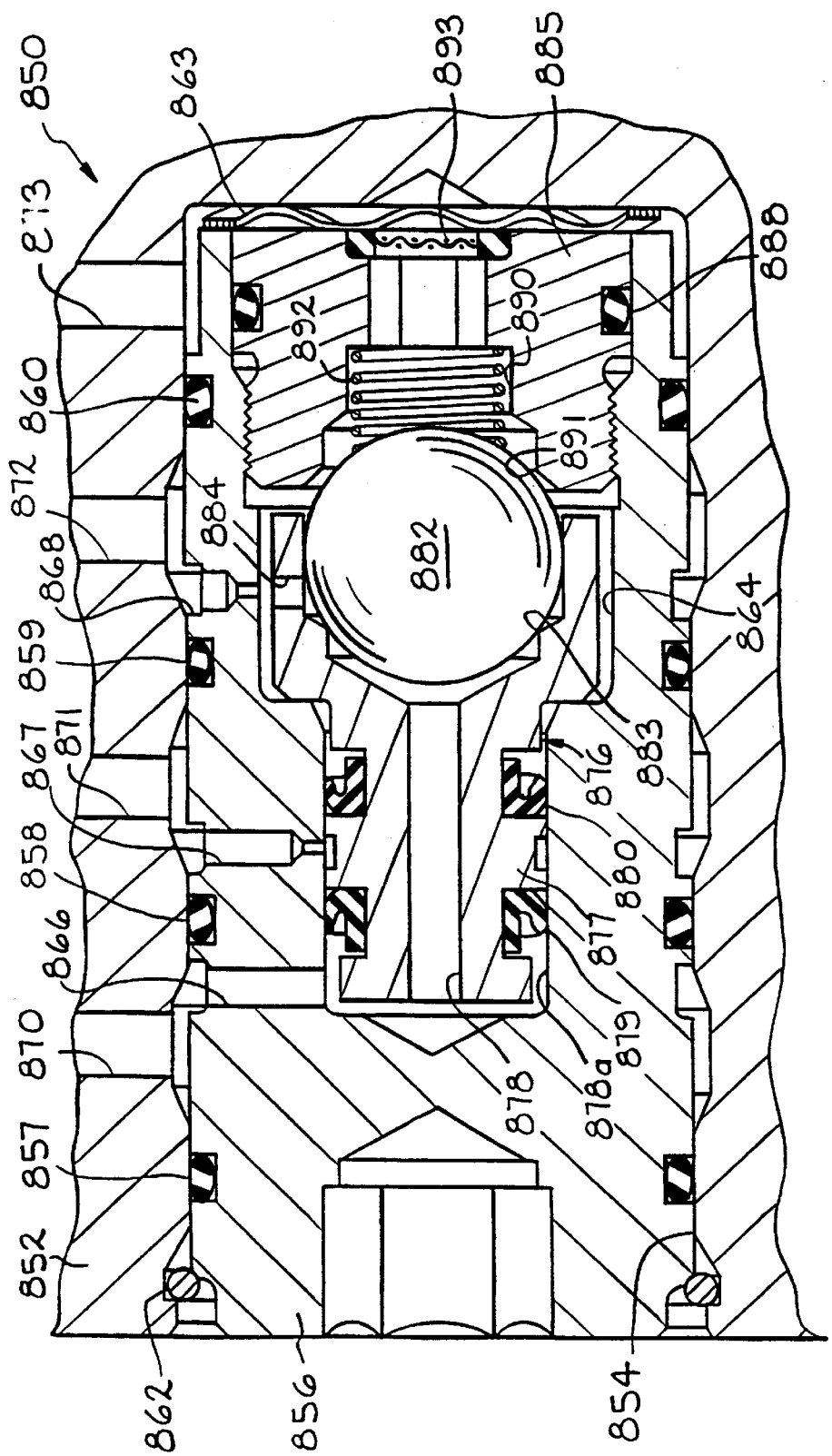
FIG. 16 is a sectional view of a first embodiment of an isolation valve.

A pedal travel simulator shut-off valve 124 is located in the conduit 121 to regulate the flow of fluid between the master cylinder 12 and the first chamber 110 of the pedal travel simulator 100. The pedal travel simulator shut-off valve 124 preferably has an open position 124*a*, and a one-way position 124*b* having a one-way check valve 126 which allows fluid to flow from the first chamber 110 of the pedal travel simulator 100 into the conduit 16 but not in the opposite direction. The pedal travel simulator shut-off valve 124 can be a normally open 2-position, 2-way pilot-operated valve which references the pressure differential between the conduit 16 and the supply conduit 20. A normally open valve is preferably used as the pedal travel simulator shut-off valve 124 to provide simple bleeding of air from the pedal travel simulator 100. However any suitable valve can be used for the pedal travel simulator shut-off valve 124, such as a solenoid actuated valve. If the boost pressure in the supply conduit 20 drops more than a predetermined amount below the pressure at which the master cylinder 12 is pressurizing the fluid in the conduit 16, the pedal travel simulator shut-off valve 124 will shuttle to its one-way position 124*b*. In the one-way position 124*b*, the pedal travel simulator shut-off valve 124 prevents the fluid from flowing into the pedal travel simulator 100 from the conduit 16. The pressurized fluid from the master cylinder 12 will thus be able to be directed through the open valves 26 and 28 to flow into the wheel brakes 22 and 23. Similarly, isolation of the pedal travel simulator 100 will allow fluid to flow from the master cylinder to the wheel brakes (not shown) of the second brake circuit 10*b*. As described in detail below, there is illustrated in FIG. 16 a first embodiment of a pedal travel simulator shut-off valve which can be used as the pedal travel simulator shut-off valve 124.

The operation of the brake system 10 shall now be described. For simplicity, generally only the operation of the first brake circuit 10*a* shall be described, since the second brake circuit 10*b* operates in a similar manner. During a normal boosted braking operation, the driver of the vehicle in which the brake system 10 is installed will depress on the brake pedal 13 to actuate the vehicle brakes 22 and 23. The term "normal boosted braking" refers to the operation of the brake system 10, wherein the ignition system of the vehicle is on and the brake system 10 has not entered into an ABS, TC, DRP, or VSC operation. Movement of the brake pedal 13 moves pistons (not shown) within the master cylinder 12, thereby pressurizing the fluid in the conduit 16, as well as the conduit 18. The pressurized fluid in the conduit 16 flows into the control port 78*a* of the boost valve 70, thereby shuttling the boost valve 70 to its third position 70*c*. In the position 70*c*, the boost valve 70 allows pressurized fluid from the source of pressurized fluid 61 to flow from the conduit 58 into the supply conduit 20. Note that during normal boosted braking, the boost enable valve 96 is shuttled to it second position 96*b*, such as by actuating the solenoid of the boost enable valve 96, thereby allowing fluid communication between the boost valve 70 and the source of pressurized fluid 61.

As will be explained in detail below, the fluid pressure generator circuit 10*c* operates to supply fluid pressure to the supply conduit 20, referred herein as "boost pressure" at a predetermined "boost ratio" in relation to the pressure generated from the master cylinder 12. The boost pressure is generally greater than the pressure within the conduit 16 by a predetermined multiple, which multiple is termed the "boost ratio". For example, if the pressure within the conduit 16 is at 100 p.s.i.g. and the boost ratio is 9, the boost valve 70 will supply fluid at about 900 p.s.i.g. to the supply conduit 20.

The pressurized fluid in the supply conduit 20 will flow through the conduits 40 and 42, through the normally open apply valves 44 and 46, and into the second chambers 32*c* and 34*c* of the fluid separators 32 and 24, respectively. The entering pressurized fluid expands the second chambers 32*c* and 34*c*, thereby advancing the pistons 32*a* and 34*a* to cause the fluid within the first chambers 32*b* and 34*b* to flow into the conduits 36 and 38, respectively. The pressurized fluid within the conduits 36 and 38 actuates the wheel brakes 22 and 23, respectively. Since the pressure within the conduit 16 will generally be lower than the pressure within the supply conduit 20, the piloted isolation valves 26 and 28 are shuttled to their closed positions 26*b* and 28*b*, respectively, to prevent direct flow of fluid from the conduits 36 and 38 into the conduit 16. With the isolation valves 26 and 28 closed, the fluid pressures at the wheel brakes 22 and 23 can exceed the pressure generated by the master cylinder 12 within the conduit 16.

When the isolation valves 26 and 28 are in their closed positions 26*b* and 28*b*, respectively, and pressure is generated by the master cylinder 12, the pressurized fluid within the conduit 16 is diverted into the pedal travel simulator 100 via the conduits 25 and 121. Note that the piloted pedal travel simulator shut-off valve 124 will be shuttled to its open position 124*a* if the pressure within the supply conduit 20 is greater than the pressure within the conduit 16, as the pressure in the conduit 20 generally is during normal boosted braking. The pressurized fluid from the conduit 121 enters the first chamber 110 of the pedal travel simulator 100, causing expansion thereof. Likewise, the isolation valves in the second brake circuit 10*b* which correspond to the isolation valves 26 and 28 will be shuttled closed when the pressure in the supply conduit 20 exceeds the pressure in the pressure in the conduit 18. Pressurized fluid from the master cylinder 12 will be diverted into the conduit 122. This fluid from the conduit 122 from the second brake circuit 10*b* will expand the second chamber 114. Expansion of the first and second chambers 110 and 114 advances the piston 104 against the force of the spring 120. The spring 120 exerts an ever increasing reactionary force on the piston as the spring 120 is compressed, which reactionary force is hydraulically transferred by way of the conduits 16 and 18 through the master cylinder 12 back to the brake pedal 13. Preferably, the pedal travel simulator 100 is designed to provide the driver with a pedal feel, or a reactionary force acting on the brake pedal, which is similar to typical brake systems. However, the pedal travel simulator 100 can be designed so as to create any suitable desirable reactionary force.

Based on information from the pressure switch 66, the ECU 27 may actuate the motor 54 of the pump 52 to supply relatively high pressure to the conduit 58 and the high pressure accumulator 60 within a selected pressure range, such as between 2000 and 3000 p.s.i.g. The boost valve 70 will shuttle between its positions 70*a*, 70*b*, and 70*c* to maintain the pressure in the supply conduit 20 at a pressure which is generally equal to the pressure within the conduit 16 generated by the master cylinder 12 multiplied by the boost ratio.

Orifices (not shown) may optionally be included in the fluid circuits of the first positions 26*a* and 28*a* of the isolation valves 26 and 28, respectively. The orifices help prevent a large amount of fluid passing through the isolation valves 26 and 28 during a sudden, hard brake apply, before the isolation valves 26 and 28 are shuttled to their closed positions 26*b* and 28*b* by the pressure increase in the supply conduit 20. Generally, the initial pressure produced at the wheel brakes 22 and 23 by fluid flowing through the isolation valves 26 and 28, respectively, sets the lowest pressure threshold that can be achieved at the wheel brakes 22 and 23 during ABS braking, because the isolation valves 26 and 28 close during ABS braking trapping this initial pressure at the wheel brakes 22 and 23. Thus, it may be desirable to have the orifices to prevent the passage of a large amount of fluid during a sudden, hard brake apply.

The fluid separators 32 and 34 fluidly isolate the fluid within the conduits 16, 24, 25, 36, and 38 from the fluid within the supply conduit 20 from the source of pressurized fluid in case of a failure within the fluid pressure generator circuit 10c. For example, if a failure occurred in the fluid pressure generator circuit 10c, wherein pressurized fluid leaked therefrom, the fluid separators 32 and 34 prevent the fluid from the master cylinder 12 from escaping through the conduits 16 and 18. Note that the reservoir 14 preferably has internal walls "W" below the top of which the pump 52 of the fluid pressure generator circuit cannot lower the level of the fluid held for supply to the first brake circuit 10a and the second brake circuit 10b. Thus, the pump 52 cannot drain the reservoir 14 completely. In the event a rupture of the fluid pressure generator circuit 10c, the master cylinder 12 would still be able to provide pressurized fluid to the wheel brakes 22 and 23, via the conduits 24 and 25, respectively. Note that the isolation valves 24 and 26 will shuttle to their respective open positions 26a and 28a if the pressure within the conduit 16 is greater than the pressure within the supply conduit 20 minus the force required to overcome the springs biasing the isolation valves 26 and 28 to their open positions 26a and 28a.

When the driver releases the brake pedal 13, the boost valve 70 shuttles to the first position 70a, such that the supply conduit 20 is in fluid communication with the conduit 21. The fluid pressure at the wheel brakes 22 and 23 is reduced as the fluid flows into the first chambers 32b and 34b of the fluid separators 32 and 34, respectively, thereby advancing the pistons 32a and 34a to contract the second chambers 32c and 34c, respectively. The fluid from the second chambers 32c and 34c returns to the reservoir 14 via the supply conduit 20, through the boost valve 70, and through the conduits 21, 59, and 56. The isolation valves 26 and 28 are shuttled to their open positions 26a and 28a, respectively, as the pressure in the supply conduit 20 drops below a predetermined pressure and any residual pressurized fluid in the wheel brakes 22 and 23 flows back into the master cylinder 12 via the conduit 16.

During an ABS braking event, the fluid pressure generator circuit 10c admits pressurized fluid into the supply conduit 20 in a similar manner as during normal boosted braking, as described above. However, during an ABS braking event, the ECU 27 controls the apply valves 44 and 46 and the dump valves 48 and 49 to regulate the pressure at the wheel brakes 22 and 23. For example, if the ECU 27 detects that the wheel corresponding to the wheel brake 22 begins to slip appreciably during braking, an ABS dump mode may be entered into. The pressure at the wheel brake 22 is reduced to allow the wheel to spin back up to vehicle speed. To reduce the pressure at the wheel brake 22, the apply valve 44 is shuttled to its one-way position 44b, such as by actuating the solenoid of the apply valve 44. When the apply valve 44 is in the one-way position, pressurized fluid from the supply conduit 20 is prevented from reaching the fluid separator 32. The dump valve 48 is shuttled to its open position 48b by actuating the solenoid thereof, thereby allowing the pressurized fluid in the second chamber 32c of the fluid separator 32 to flow back to the reservoir 14 via the conduits 51, 21, 59, and 56. The brake system 10 may enter into an ABS hold mode to give the wheel time to spin back up to speed. During the ABS hold mode, the pressure at the wheel brake 22 is held constant by shuttling the apply valve 44 to its one-way position 44b and keeping the dump valve 48 in its one-way position 48a.

When the ECU 27 detects that the wheel associated with the wheel brake 22 spins back up to near vehicle speed, an ABS apply mode can be entered into, in which pressure is increased at the wheel brake 22. The apply valve 44 is shuttled to its open position 44a and the dump valve 48 is shuttled to (or remains in) its one-way position 48a. This allows the pressurized fluid in the supply conduit 20 to expand the second chamber 32c of the fluid separator 32. The expansion of the second chamber 32c causes the piston 32a to move to pressurize the fluid in the first chamber 32b, thereby supplying pressurized fluid to the wheel brake 22. The brake system 10 may enter the ABS dump, hold, and apply modes several times during a single ABS event.

When a driven wheel begins to slip during acceleration, the brake system 10 may enter into a traction control (TC) mode. The slipping wheel is braked to slow the slipping wheel and regain traction for maximum vehicle acceleration. During a TC mode, the ECU 27 actuates the fluid pressure generator circuit 10c to provide pressurized fluid to the supply conduit 20 and actuates the apply valves associated with the non-slipping wheels to their respective closed one-way positions. For example, if the ECU 27 detects that a driven wheel associated with the wheel brake 23 is slipping appreciably, the ECU 27 shuttles the boost valve 70 to its third position 70c, such as by energizing a solenoid 127 operatively connected to the boost valve 70. The ECU 27 also shuttles the boost enable valve 96 to its open position 96b, and may actuate the motor 54 for the pump 52 if the pressure from the high pressure accumulator 60 falls below a predetermined pressure level. Thus, the fluid pressure generator circuit 10c provides pressurized fluid to the supply conduit 20. The apply valve 44 is shuttled to the one-way position 44b, thereby preventing pressurized fluid from actuating the wheel brake 22 which is associated with a non-slipping wheel. The apply valve 46 is pulsed from the one-way position 46b to the open position 46a. The pressurized fluid in the supply conduit 20 flows into the second chamber 34c of the fluid separator 34, thereby pressurizing the fluid in the second chamber 34c and the wheel brake 23 via the conduit 38. A traction control hold mode may be entered to keep the pressure constant at the wheel brake 23. During traction control hold mode, the apply valve 46 is shuttled to the one-way position 46b, to prevent the flow of fluid to the wheel brake 23. When the ECU 27 detects that the speed of the driven wheel has been reduced to near the vehicle speed, a traction control dump mode may be entered into to reduce the brake pressure at the wheel brake 23. During a traction control dump mode the apply valve 46 is shuttled to (or remains in) the one-way position 46b to restrict the flow of fluid to the wheel brake 23, and the dump valve 49 is shuttled to the open position 49b. The pressurized fluid in the second chamber 34c of the fluid separator 34 flows out through the dump valve 49 and back to the reservoir 14 via the conduits 51, 21, 59, and 56. After the traction control event has ended, the boost valve 70 is moved to its first position 70a to allow the pressurized fluid in the supply conduit 20 to return to the reservoir 14 via the conduits 21, 59, and 56. At the conclusion of the TC event as at the conclusion of an ABS, VSC normal boosted braking event, the valves 44 and 46 are deenergized to return to their positions 44a and 46a, respectively, and the dump valves 48 and 49 are deenergized to their one-way positions 48a and 49*a*, respectively. Note that the brake system 10 may include a redundant brake switch 125 in fluid communication with the conduit 16 or 18 to provide an input signal when the driver is depressing the brake pedal 13. Alternatively, the pressure transducer 30 may signal the ECU 27 that the driver of the vehicle has depressed the brake pedal 13.

During a VSC event, braking may be required on one or more wheels to improve cornering stability of the vehicle. The driver of the vehicle may or may not be braking at that time, and the braking pressures required may exceed the pressure generated by the master cylinder 12. The pressure transducer 30 relays information to the ECU 27 of the pressure in the conduit 16. The ECU 27 actuates the solenoid 127 of the boost valve 70 in a similar manner as during a TC mode, as described above. The apply valves 44 and 46 and the dump valves 48 and 49 corresponding to the wheel brakes 22 and 23 to be actuated control the wheel brake pressure to achieve the desired braking effect. In the brake system 10, each wheel brake can be independently modulated from the others.

The brake system 10 may also be used to provide Dynamic Rear Proportioning (DRP). When the brake system 10 enters into a DRP mode, the braking pressures on the front and rear wheels brakes are separately controlled to achieve greater braking performance at the front and rear axles. For example, the brake system 10 can be configured such that the first circuit 10*a* is associated with the front wheels and the second circuit 10*b* can be associated with the rear wheels. The respective apply valves and dump valves of the first and second circuits 10*a* and 10*b* are regulated to increase or decrease the braking pressure at the wheels of the rear brakes at a different pressure from the front brakes, as required to achieve maximum braking effort with minimum wheel slippage. Of course, since the brake system 10 can modulate pressure at any wheel individually, as described with respect to VSC operation above, it is anticipated that a DRP operation can be accomplished in a diagonally split system also.

Figure 2:
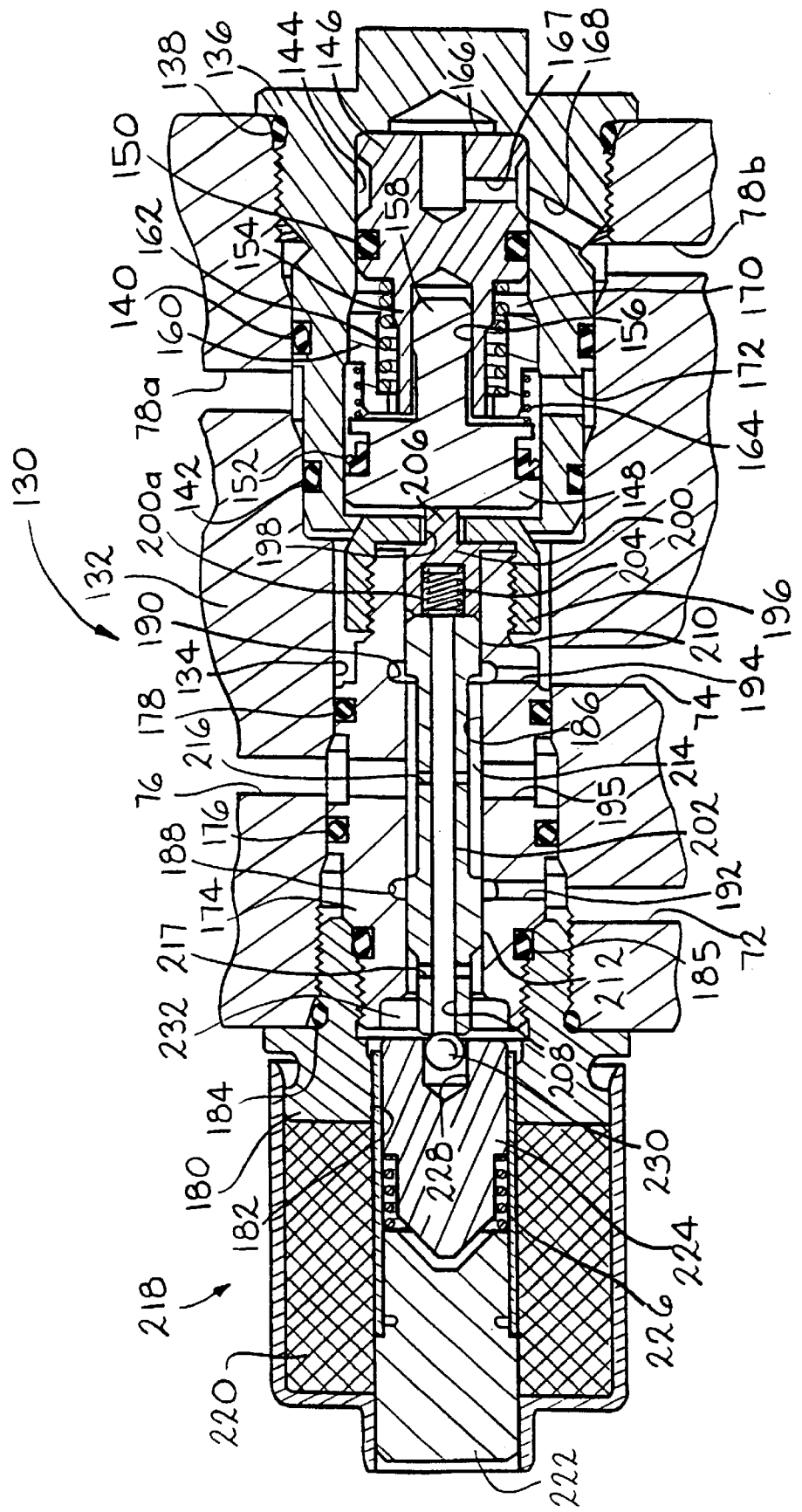
FIG. 2 is a sectional view of a first embodiment of a boost valve shown in FIG. 1.

Referring now to FIG. 2, there is illustrated a first embodiment of a boost valve, indicated generally at 130, which can be used as the boost valve 70 of the brake system 10 illustrated in FIG. 1. The boost valve 130 is a spool valve design. The boost valve 130 includes a housing 132 having a multi-stepped cylindrical bore 134 formed therethrough. A first end plug 136 is disposed in the bore 134 sealing one end thereof. Preferably, the first end plug 136 is threadably attached to the housing 132, but can be fixably attached by any suitable manner. Three axially spaced, circumferentially extending elastomeric seals 138, 140, and 142 are disposed about the first end plug 136 to form three leak tight seals between the first end plug 136 and the surface of the housing 132 defining the bore 134. The first end plug 136 has an axially extending cylindrical cavity 144 formed therein facing the interior of the housing 132. Disposed within the cavity 144 of the first end plug 136 are first and second pistons 146 and 148. The first and second pistons 146 and 148 are sealingly engaged with the wall of the cavity 144 of the first end plug 136 by elastomeric seals 150 and 152, respectively. The first piston 146 includes a tubular extension 154 extending outwardly from the first piston 146. The tubular extension 154 has a bore 156 adapted to receive a cylindrical extension 158 extending from the second piston 148. An annular spring guide 160 is disposed within the cavity 144 of the first end plug 136, positioned between the first and second pistons 146 and 148. The spring guide 160 is preferably press fit in the cavity 144, thereby fixing the position of the spring guide 160 relative to the first end plug 136. A first spring 162 is located between the spring guide 160 and the first piston 146. The first spring 162 biases the first piston 146 rightward, as viewing FIG. 2. A second spring 164 is located between the spring guide 160 and the second piston 148. The second spring 164 biases the second piston 148 leftward, as viewing FIG. 2. Thus the first and second springs 162 and 164 bias the first and second piston 146 and 148, respectively, away from each other.

A first chamber 166 is generally defined by the seal 150, the right-hand end of the first piston 146, as viewing FIG. 2, and the first end plug 136. The first chamber 166 is in fluid communication with a passageway 167 formed through the first piston 146 and with a first transverse hole 168 formed through the first end plug 136. The hole 168 is in fluid communication with a fluid port, such as the control port 78*b* of the brake circuit 10 of FIG. 1. A second chamber 170 is generally defined by the first and second pistons 146 and 148, the seals 150 and 152, and the first end plug 136. The second chamber 170 is in fluid communication with a second transverse hole 172 formed through the first end plug 136. The second hole 172 is in fluid communication with a fluid port, such as the control port 78*a* of the brake circuit 10 of FIG. 1.

The boost valve 130 further includes a sleeve 174 disposed in the bore 134 of the housing 132. A pair of axially spaced, circumferentially extending elastomeric seals 176 and 178 are disposed about the sleeve 174 to form a pair of leak tight seals between the sleeve 174 and the surface of the housing 132 defining the bore 134. The sleeve 174 is retained in the housing 132 by a second end plug 180 having a bore 182 formed therethrough. Preferably, the second end plug 180 is threadably attached to the housing 132, but can be fixably attached by any suitable manner. An axially spaced, circumferentially extending elastomeric seal 184 is disposed about the second end plug 180 to form a leak tight seal between the second end plug 180 and the housing 132. The sleeve 174 is fixably attached to the end plug 180 and sealingly engaged therewith by an elastomeric seal 185. The sleeve 174 has an axial bore 186 formed therethrough. A pair of radially outwardly extending annular grooves 188 and 190 are formed in the wall of the bore 186 of the sleeve 174. The sleeve 174 also includes a pair of passageways 192 and 194 extending radially between the outer surface of the sleeve 174 and the grooves 188 and 190, respectively, to provide fluid communication therebetween. Instead of having the annular grooves 188 and 190 and the radial passageways 192 and 194, a pair of radial slots can be formed through the sleeve 174 to provide fluid communication with the axial bore 186 and the conduits 72 and 74. A transverse passageway 195 extends through the sleeve 174 and is axially located between the grooves 188 and 190. An annular cap 196 is fixably attached to the right-hand end, as viewing FIG. 2, of the sleeve 174, such as by a threaded connection. The cap 196 has an axial bore 198 formed therethrough. The cap 196 is positioned adjacent the second piston 148.

Disposed within the bore 186 of the sleeve 174 are first and second spools 200 and 202. The first spool 200 is cup shaped with an axially extending recess 200*a* formed therein. The recess 200*a* opens toward the second spool 202. The first and second spools 200 and 202 are biased away from each other by a spring 204 disposed within the recess 200*a* and acting between the first and second spools 200 and 202. The first spool 200 includes an extension pin 206 extending axially from the first spool 200 through the bore 198 of the cap 196. The pin 206 is disposed to bear against the left-hand end, as viewing FIG. 2, of the second piston 148. The second spool 202 has an axial bore 208 formed therethrough and includes a first cylindrical shaped land 210 and a second cylindrical shaped land 212. An annular central annular chamber 214 is generally defined by the bore 186 of the sleeve 174 and the second spool 202 between the first and second lands 210 and 212. The first and second lands 210 and 212 are preferably spaced apart by a predetermined distance which is slightly less than the distance between the grooves 188 and 190 so that only one of the grooves 188 or 190 can be in fluid communication with the central chamber 214 at a time.

The second spool 202 has first and second radial passageways 216 and 217 formed therethrough. The first radial passageway 216 extends through the sleeve 174 between the first and second lands 210 and 212. The first radial passageway 216 is in fluid communication with the bore 208 of the second spool 202 and with the central chamber 214, and from there, in fluid communication with the transverse passageway 195, as indicated above. The central chamber 214 is in fluid communication with the transverse passageway 195.

The transverse passageway 195 is in fluid communication with a fluid port formed through the housing, such as the third port 76 of the boost valve 70 of the brake system 10 of FIG. 1. The groove 188 of the sleeve 174 and the radial passageway 192 of the second spool 202 are in fluid communication with a fluid port, such as the first port 72 of the boost valve 70 of the brake system 10 is illustrated in FIG. 1. The groove 190 of the sleeve 174 and the radial passageway 194 of the second spool 202 are in fluid communication with a fluid port, such as the second port 74 of the boost valve 70 of the brake system 10 illustrated in FIG. 1.

Preferably, the boost valve 130 includes an electrically actuated solenoid, indicated generally at 218. The solenoid 218 is mounted on the housing 130 adjacent the second end plug 180. The solenoid 218 includes a coil 220, a pole piece 222 and an armature 224. A spring 226 is positioned between the pole piece 222 and the armature 224. The spring 226 biases the armature 224 rightward, as viewing FIG. 2. The armature 224 has a recess 228 formed therein which is axially aligned with the second spool 202. Preferably, the armature 224 abuts the left-hand end of the second spool 202, as viewing FIG. 2, by means of a ball 230 press fit in the recess 228. A pressure balance chamber 232 is generally defined by the right-hand end of the armature 224, the left-hand end of the second spool 202 adjacent the second land 212, the second end plug 180, the left-hand end of the sleeve 174, and the ball 230. The second radial passageway 217 hydraulically connects the pressure balance chamber 232 with the bore 208 of the second spool 202.

During assembly of the boost valve 130, the first and second spools 200 and 202 are positioned within the bore 186 of the sleeve 174. The first and second spools 200 and 202 of the boost valve 130 can be moved to first, second, and third positions thereof, which correspond to the first, second, and third positions 70a, 70b, and 70c of the boost valve 70 of FIG. 1. The boost valve 130 corresponds to the position 70a of the boost valve 70 when the first and second spools 200 and 202 are in their respective first positions as illustrated in FIG. 2. The right-hand end of the first spool 200 abuts the cap 196. The second spool 202 abuts the first spool 200, and the first land 210 is positioned so as to permit fluid communication between the second port 74 and the third port 76 via the radial passageway 194, the central chamber 214, and the transverse passageway 195. The position of the cap 196 relative to the sleeve 174 can be adjusted by a threaded connection therebetween to accurately set the first and second spools 200 and 202 in their respective first positions.

The boost valve 130 corresponds to the position 70b of the boost valve 70 when the second spool 202 is positioned in the second position thereof such that the first and second lands 210 and 212 simultaneously cover the openings of the radial passageways 192 and 194, thereby restricting the flow of fluid between the first, second, and third ports 72, 74, and 76. The boost valve 130 corresponds to the position 70c of the boost valve 70 when the second spool 202 is positioned in the third position thereof such that the first land 210 covers the opening of the radial passageway 194 and the second land 212 does not cover the opening of the radial passageway 192. Thus, the first port 72 is in fluid communication with the third port 76 via the radial passageway 192, the central chamber 214, and the transverse passageway 195.

After the first position of the first and second spools 200 and 202 are adjusted, the position of the cap 196 relative to the sleeve 174, the proper third positions of the first and second spools 200 and 202 can be set by positioning the press fit ball 230 relative to the armature 224. The press fit ball 230 is pressed into the recess 223 of the armature 224 until the gap between the armature 224 and the pole piece 222 is approximately equal to the gap between the cap 196 and the second piston 148 when the first spool 200 is in contact with the second spool 202 and the cap 149. Thus, proper travel lengths between the first and third positions of the first and second spools 200 and 202 can be easily set by changing the press fit position of the ball 230 within the bore 228 of the armature 224 without having to have extremely tight tolerances on various components of the boost valve 130.

The operation of the boost valve 130 shall now be described in cooperation with the brake circuit 10 illustrated in FIG. 1. Normally, when the master cylinder 12 is not generating pressurized fluid to the conduits 16 and 18, as shown in FIG. 2. The first and second spools 200 and 202 are in the first positions thereof. The first land 210 does not cover the opening of the radial passageway 194 and fluid can flow from the third port 76 to the second port 74 via the radial passageway 194, the central chamber 214, and the transverse passageway 195. Thus, the boost valve 130 is in the position schematically illustrated as position 70a of the boost valve 70 of FIG. 1. During normal boosted braking when the driver depresses the brake pedal 13, the master cylinder 12 pressurizes the fluid within the conduits 16 and 18 which transmits the increased pressure, respectively, into the control ports 78a and 78b.

The pressurized fluid in the port 78b acts through the first transverse hole 168 of the first end plug 136, through the passageway 167 of the first piston 146, and raises pressure in the first chamber 166. The pressurized fluid in the first chamber 166 acts against the right-hand end of the first piston 146, thereby biasing the first piston 146 leftward, as viewing FIG. 2.

The pressurized fluid entering the port 78a flows through the second transverse hole 172 of the end plug 136 and biases the first and second pistons 146 and 148 away from each other, thereby advancing the second piston 148 leftward. Normally, the first piston 146 does not move leftward due to various factors, such as the biasing force from the spring 162, and the friction between the seal 150 and the surface of the bore 144 of the first end plug 136. These forces opposing movement are normally greater than the differential pressure forces urging the first piston 146 to move leftward.

In the event of a failure of the conduit 16 or component connected thereto, is resulting in a sufficiently lower pressure acting on the left-hand side of the first piston 146, compared to the pressure in the first chamber 166, the first piston 146 will move leftward, driving the second piston 148 leftward, as viewing FIG. 2.

Leftward movement of the second piston 148 causes the second piston 148 to push against the extension pin 206 of the first spool 200, thereby moving the first and second spools 200 and 202 leftward. Continued movement of the second spool 202 to the third position thereof will position the first land 210 so as to cover the opening of the radial passageway 194 and position the second land 212 so as to expose the opening of the radial passageway 192. Thus the boost valve 130 is in a position similar to the position 70c of the boost valve 70 such that fluid can flow from the first port 72 to the third port 76 via the radial passageway 192, the central chamber 214, and the transverse passageway 195. The second spool 202 is moved back to the right when the fluid pressure in the central chamber 214 reaches a pressure which is equal to the boost ratio multiplied by the pressure generated from the master cylinder 12 which is acting against the first and second pistons 146 and 148. The boost ratio is generally determined by the relative working areas of the first spool 200 and the second piston 148. The second spool 202 may briefly move into the first position thereof, that is, the position corresponding to the position 70a of the boost valve 70, to allow fluid communication between the second port 74 and the third port 76, thereby lowering the fluid pressure in the supply conduit 20. Eventually, an equilibrium will be reached and the boost valve 130 will stay in the second position thereof corresponding to the position 70b of the boost valve 70, thereby maintaining a pressure in the supply conduit 20 that is greater than the pressure generated by the master cylinder 12 by a factor of the boost ratio.

When the driver releases the brake pedal 13, the pressure at the control ports 78a and 78b is reduced. The spring 262 will bias the second spool 202 rightward, thereby moving the second spool 202 back to the first position thereof, corresponding to position 70a of the boost valve 70. During an ABS event, the boost valve 130 operates in a similar manner as during normal boosted braking.

When the brake system 10 operates under a TC or certain VSC modes in which the driver has not depressed the brake pedal 13, the solenoid 218 can be actuated to provide boost pressure to the brake system 10. Since the driver has not depressed the brake pedal 13, the first and second spools 200 and 202 are not biased leftward by pressure generated by the master cylinder 12 at the control ports 78a and 78b. The coils 220 of the solenoid 218 are energized to cause leftward movement of the armature 224, as viewing FIG. 2. The spring 204 between the first and second spools 200 and 202 biases the second spool 202 to the left, thereby moving the second spool 202 into the third position thereof, corresponding to the position 70c of the boost valve 70. When the ECU 27 determines that fluid pressure in the supply conduit 20 should no longer be increased, the solenoid 218 is deactuated and the spring 226 causes the armature 224 to push the second spool 202 back to the right, thereby moving the second spool 202 into a position corresponding to the position 70a of the boost valve 70. Fluid in the central chamber 214 can also flow into the pressure balance chamber 232 through the second radial passage 217 to help balances the pressure acting on second spool 202 so that it can be positioned with a relatively low force.

Figure 3:
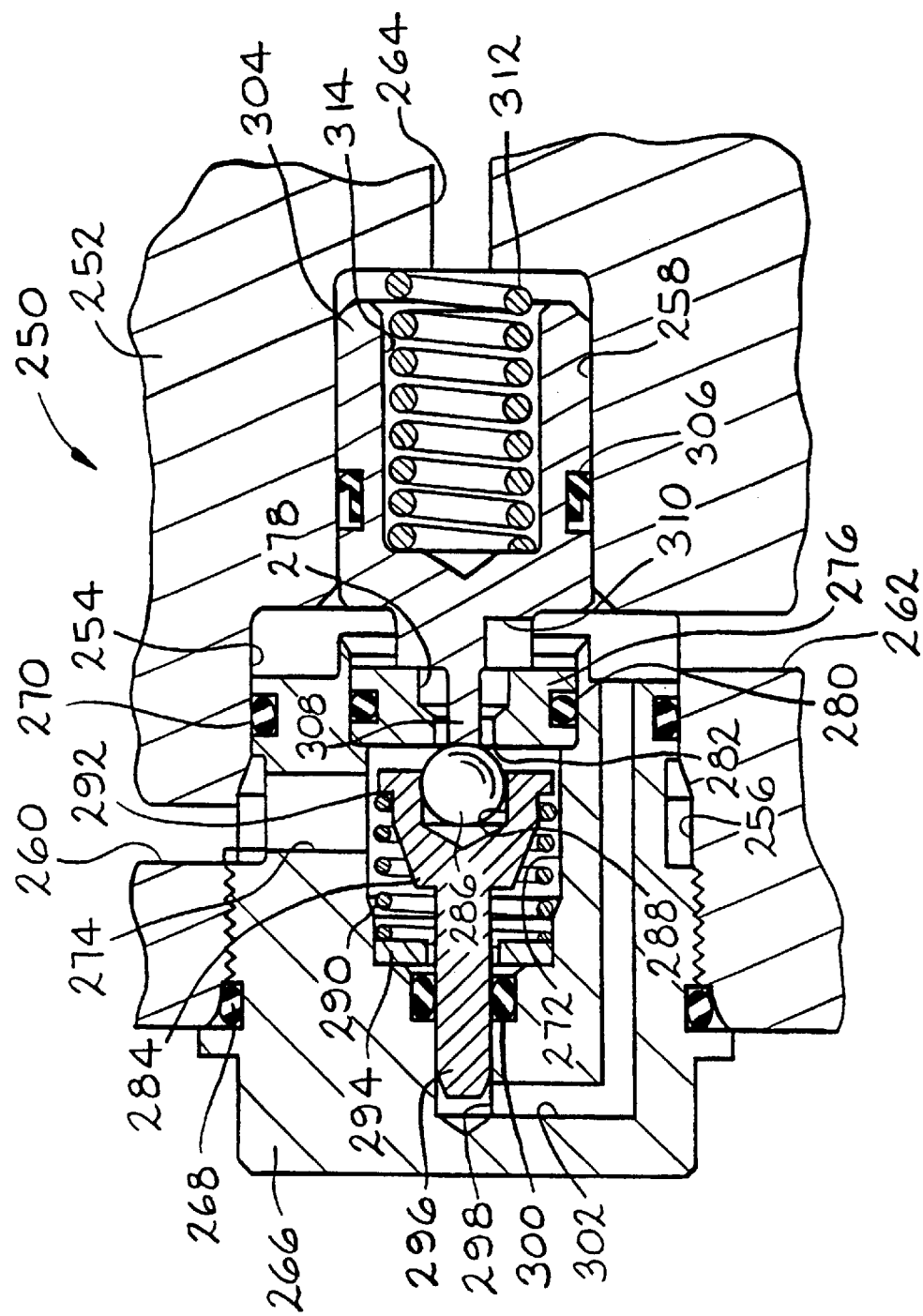
FIG. 3 is a sectional view of a first embodiment of a pressure regulator valve shown in FIG. 1.

Referring now to FIG. 3, there is illustrated a first embodiment of a pressure regulator valve, indicated generally at 250, which can be used as the pressure regulator valve 80 of the brake system 10 illustrated in FIG. 1. The pressure regulator valve 250 includes a housing 252 having a stepped bore 254 formed therein. The bore 254 has a large diameter portion 256 and a small diameter portion 258. The housing 252 has a pair of conduits 260 and 262 formed therein which are in fluid communication with axially spaced portions of the large diameter portion 256 of the bore 254.

If the pressure regulator valve 250 is used as the pressure regulator valve 80 in the brake system 10 of FIG. 1, the conduit 262 corresponds to the portion of the conduit 58 of the brake system 10 connecting the pressure regulator valve 80 to the boost valve 70. The conduit 260 corresponds to that portion of the conduit 58 connecting the pressure regulator valve 80 to the outlet 52b of the pump 52. The housing also has a conduit 264 formed therein which is in fluid communication with the smaller diameter portion 258 of the stepped bore 254. If the pressure regulator valve 250 is used in the brake system 10 of FIG. 1, the conduit 264 corresponds to the control port 86 connected to the conduit 79.

The pressure regulator valve 250 includes an end plug 266 disposed within the large diameter portion 256. A pair of axially spaced elastomeric seals 268 and 270 sealingly engage the end plug 266 and the housing 252. The end plug 266 has a central bore 272 and a radial bore 274 formed therein which are in fluid communication with each other. The radial bore 274 is in fluid communication with the conduit 260.

An annular plug 276 having a central passageway 278 is sealingly disposed in the central bore 272 of the end plug 266. An elastomeric seal 280 sealingly engages both the annular plug 276 and the end plug 266. The central passageway 278 provides fluid communication between the conduits 260 and 262. A valve seat 282 is formed at the opening of the right-hand end, as viewing FIG. 3, of the central passageway 278. The pressure regulator valve 250 further includes a poppet 284 slidably disposed within the end plug 266. The poppet 284 is generally cylindrical, but has an enlarged cup-shaped body formed at the right-hand end, as viewing FIG. 3, thereof. The cup shaped body has an axially extending recess 288 formed in the right-hand end face of the poppet 284. A circumferentially radially outwardly extending flange 292 is formed at the right-hand end of the cup-shaped body of the poppet 284. The poppet 284 has a valve sealing member, such as a ball 286, fixably retained in the recess 288 formed in the poppet 284, such as by a press fit. The ball 286 and the valve seat 282 cooperate to restrict the flow of fluid between the conduits 260 and 262, thereby selectively closing the pressure regulator valve 250. A spring 290 is positioned between the outwardly extending flange 292 formed on the poppet 284 and a retainer washer 294 disposed in the central bore 272 of the end plug 266. The spring 290 biases the poppet 284 and the ball 286 towards the valve seat 282. The poppet 284 includes a plunger portion 296 at the left-hand end, as viewing FIG. 3, thereof. The plunger portion 296 is slidably disposed within a small diameter portion 298 of the central bore 272 of the end plug 266. An elastomeric seal 300 sealingly engages the with the small diameter portion 298. A passageway 302 formed in the end plug 266 is in fluid communication with the conduit 262. The conduit 302 corresponds to the conduit 84 and control port 82 of FIG. 1, providing feedback of the pressure between the boost valve 70 and the pressure regulator valve in a manner tending to close the pressure regulator valve. The passageway also 302 provides pressure balancing of the right-hand and left-hand ends of the poppet 284 with respect to the pressure within the conduit 262.

The pressure regulator valve 250 further includes a piston 304 which is slidably disposed within the small diameter portion 258. An elastomeric seal 306 sealingly engages the piston 304 and the housing 252. The piston 304 includes an extension 308 extending through the central passageway 278 of the annular plug 276 in a direction towards the ball 286. The extension 308 has a slot 310 formed therein to permit the flow of fluid between the conduit 262 and the central passageway 278. A spring 312 is disposed within an axially extending recess 314 formed in the right-hand face, as viewing the FIG. 3, of the piston 304. The spring 312 biases the piston 304 in a direction towards the annular plug 276.

The operation of the pressure regulator valve 250 shall now be described in cooperation with the brake circuit 10 illustrated in FIG. 1. The pressure regulator valve 250 generally maintains a relatively small pressure drop, such as for example less than about 100 p.s.i.g., across the boost valve 70, between the conduits 262 and 264. As indicated above, the conduits 262 and 264 correspond to the conduit 58 connecting the pressure regulator valve 80 to the boost valve 70, and the conduit 79 of the brake system 10, respectively. When the boost valve 70 closes, i.e., when the poppet 284 and the ball is seated against the valve seat 282, the pressure in the conduit 267 rises. The pressure in the conduit 264 remains constant or falls depending on whether the boost valve 70 acts to hold pressure in the supply conduit 20 or to lower pressure in the supply conduit 20. If the pressure differential between the conduits 58 and 79 rises to approximately 100 p.s.i.g., the force generated by the pressure of the fluid in the conduit 262 acts through the conduit 302, biases the piston 304 to the right against the force of the spring 312 and the force exerted by the fluid in the conduit 264 acting on the right-hand end of the piston 304. Continued rightward movement of the piston 304 will cause the extension 308 thereof to move to the right sufficiently to permit seating of the ball 286 against the valve seat 282, thereby closing off the fluid communication between the conduits 260 and 262. The closed boost valve 70 may have a tendency to leak slightly over extended periods of time, in particular if the boost valve 70 is of the spool type design. The use of the pressure regulator valve 250 provides that the large pressure drop between the source of pressurized fluid 61 and the supply conduit 20 on the downstream side of the boost valve 70 occurs across the pressure regulator valve rather than across the boost valve 70, thereby reducing the differential pressure across the boost valve 70, and consequently, reducing the leakage therethrough.

When the boost valve 70 opens and the pressure differential between the conduits 58 and 79 drops below a certain pressure, such as 100 p.s.i.g., the resultant differential pressure across the piston 304 in cooperation with the force of the spring 312, moves the piston 304 leftward, as viewing FIG. 3. Sufficient leftward movement of the piston 304 causes the extension 308 to push against the ball 286, thereby lifting the ball 286 from the valve seat 282, thereby opening the pressure regulator valve 250. The conduit 302 and the seal 300 provide for pressure balancing of the poppet 284, thereby allowing the poppet 284 to be moved easily by the extension 308 of the piston 304.

Figure 4:
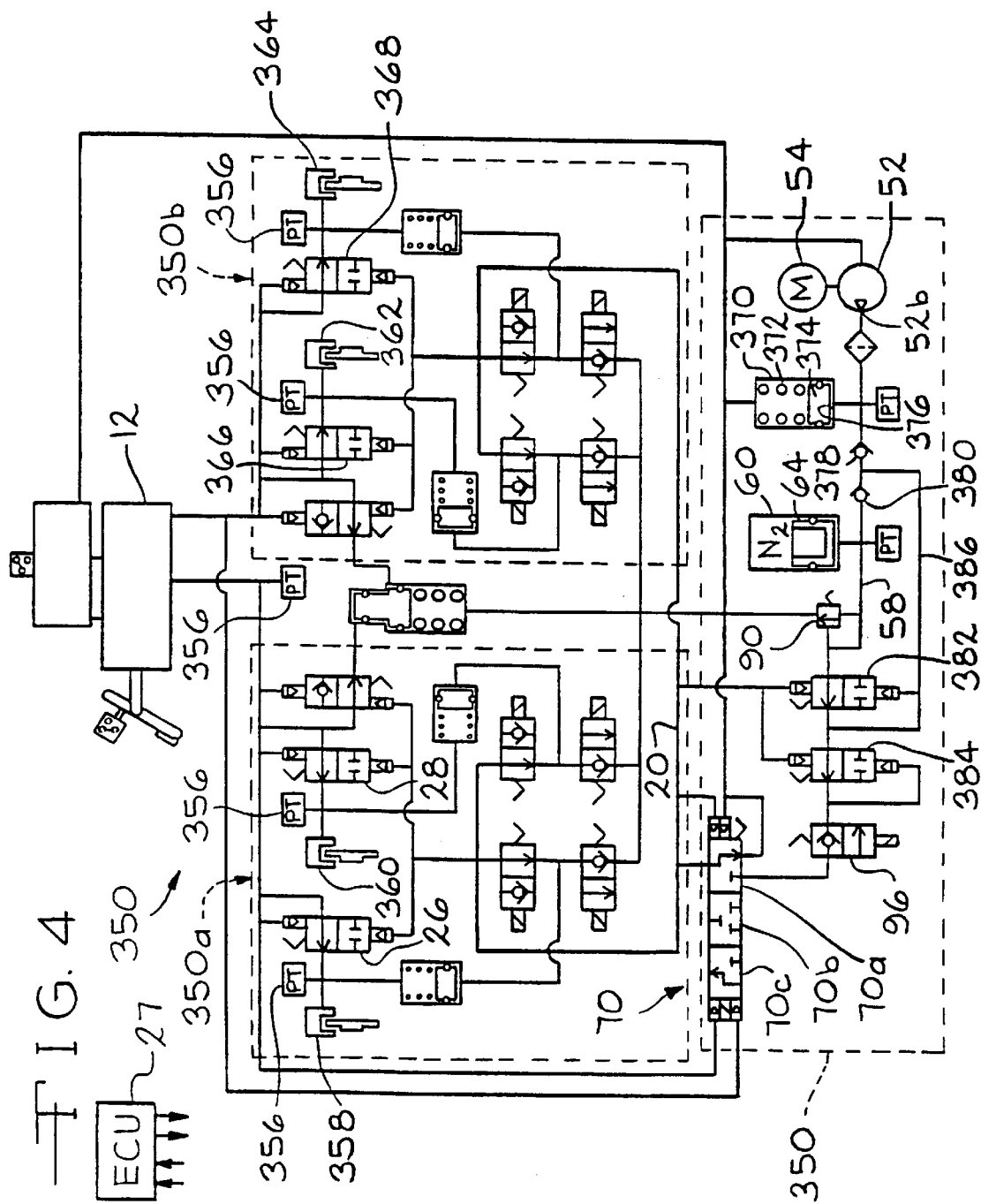
FIG. 4 is a hydraulic schematic of a second embodiment of a brake system in accordance with the present invention.

Referring now to FIG. 4, there is illustrated a hydraulic schematic of a second embodiment of a vehicle brake system, indicated generally at 350. The brake system 350 is similar in function and structure to the brake system 10 of FIG. 1, except as noted below. Due to the similarity of the brake systems 10 and 350, components which are similar in structure and function to both of the brake systems 10 and 350 may not be described or may be assigned the same reference number. The brake system 350 includes two braking circuits 350a and 350b which include a plurality of pressure transducers 356 which are in fluid communication with wheel brakes 358, 360, 362, and 364. Both of the brake circuits 350a and 350b have "manual push through" to the wheel brakes 358, 360, 362, and 364, wherein pressurized fluid from the master cylinder 12 can be sent to the wheel brake 358, 360, 362, and 364 when the isolation valves 26, 28, 366, and 368, respectively, are in their open positions.

The brake system 350 has a fluid pressure generator circuit 350c which includes a medium pressure accumulator 370. The medium pressure accumulator 370 is in fluid communication with the conduit 58 between the high pressure accumulator 60 and the pump 52. The medium pressure accumulator 370 includes a spring 372 which biases a piston 374 for the storage of pressurized fluid within a chamber 376. Of course, the medium pressure accumulator 370 can be any suitable structure. The medium pressure accumulator 370 stores fluid at pressure which is generally less than the pressure of the fluid stored in the high pressure accumulator 60, the reason for which will be explained below. For example, the medium pressure accumulator 370 may store pressure at about 700 to 800 p.s.i.g., however, any suitable storage pressures may be used.

The fluid pressure generator circuit 350c further includes a pair of check valves 378 and 380 located in the conduit 58 between the high pressure accumulator 60 and the medium pressure accumulator 370. The check valves are both oriented to allow fluid to flow in a direction from the pump outlet 52b to the high pressure accumulator 60, but not in the opposite direction.

The fluid pressure generator circuit 350c includes first and second pressure regulator valves 382 and 384 located in the conduit 58 between the boost enable valve 96 and the high pressure relief valve 90. The first pressure regulator valve 382 is preferably a pilot-operated valve which is shuttled by the pressure differential between the pressure in the supply conduit 20 and the pressure in the conduit 58 between the first and second pressure regulator valves 382 and 384. The second pressure regulator valve 384 is preferably a pilot-operated valve which is shuttled by the pressure differential between the pressure in the supply conduit 20 and the pressure in the portion of the conduit 58 between the second pressure regulator valve 384 and the boost enable valve 96. A conduit 386 is in fluid communication with the portion of the conduit 58 between the check valves 378 and 380 and the portion of the conduit 58 between the first and second pressure regulator valves 382 and 384. Thus, the conduit 386 directs the pressurized fluid from the medium pressure accumulator 370 past the first pressure regulator valve 382 to the inlet of the second pressure regulator valve 384.

The operation of the brake system 350 is similar to the operation of the brake system 10 of FIG. 1. However, the medium pressure accumulator 370 generally provides suitable braking pressures for most of the brake applications for the brake system 350. Typically, when the boost valve 70 is not delivering boosted pressure to the supply conduit 20, the pressure in the conduit 386 will generally be equal to the storage pressure of the medium pressure accumulator 370. When the boost valve 70 is opened to provide boosted pressure to the supply conduit 20, the pressure differential between the supply conduit 20 and the portion of the conduit 58 between the valve 384 and the boost enable valve 96 will drop below a first predetermined pressure level and the second brake pressure regulator valve 384 will open. If, as normally occurs, this results in pressure being supplied to the boost valve 70 greater than the pressure required, no further actions occur, until the boost valve 70 shuts. If, however, the braking circuits 350*a* and 350*b* require pressures equal to or greater than the pressures provided by the medium pressure accumulator 370 due to a brake demand for exceptionally high pressures, the pressure differential between the supply conduit 20 and the conduit 58 between the first and second pressure regulator valves 382 and 384 will fall below a second predetermined pressure level and the first pressure regulator valve 382 will open. The second pressure regulator valve 384 will also remain open and relatively high pressure fluid from the high pressure accumulator 60 will flow through both the first and second pressure regulator valves 382 and 384, through the boost enable valve 96, and through the boost valve 70 to the braking circuits 350*a* and 350*b*. When the pressures required in the braking circuits 350*a* and 350*b* fall below the pressure provided by the medium pressure accumulator 370 by the second predetermined pressure level, a pressure differential is sensed between the conduit 20 and the portion of the conduit 58 between the first and second pressure regulator valves 382 and 384, thereby closing the first pressure regulator valve 282. When the booster valve 70 moves to the position 70*a*, the pressure differential between the conduits 58 and 20 rises, and when the first predetermined pressure level is reached, the second pressure regulator valve 384 closes. Thus, the pressurized fluid requirements of the braking circuits 350*a* and 350*b* are met by using the medium pressure accumulator 370 for most of the braking needs and the high pressure accumulator 60 for occasional high pressure requirements. By using a spring biased medium pressure accumulator 370 for the majority of the braking, the seal on the piston 64 of the high pressure accumulator 60 remains relatively unworn longer, and the pressurized gas in the high pressure accumulator 60 is less likely to leak past the piston 64. The life of the high pressure accumulator 60 can thus be extended and require less frequent recharging. In addition, the pump 52 operates under lower pressures when filling the medium pressure accumulator 370 as compared to filling the high pressure accumulator 60. Since the medium pressure accumulator 370 is normally the only accumulator drawn down during braking, the pump 52 need only operate to recharge the medium pressure accumulator. When the pump 52 operates under lower pressures, the motor 54 operates more quietly and uses less current.

The brake system 350 can be used in a "diagonal split" brake system such as by connecting the wheel brake 358 to the left front wheel, the wheel brake 362 to the left rear wheel, the wheel brake 360 to the right rear wheel, and the wheel brake 364 to the right front wheel. Alternatively, the brake system 350 can be used in a "vertical split" brake system such as by connecting the wheel brake 358 to the left front wheel, the wheel brake 362 to the left rear wheel, the wheel brake 360 to the right front wheel, and the wheel brake 364 to the right rear wheel.

Figure 5:
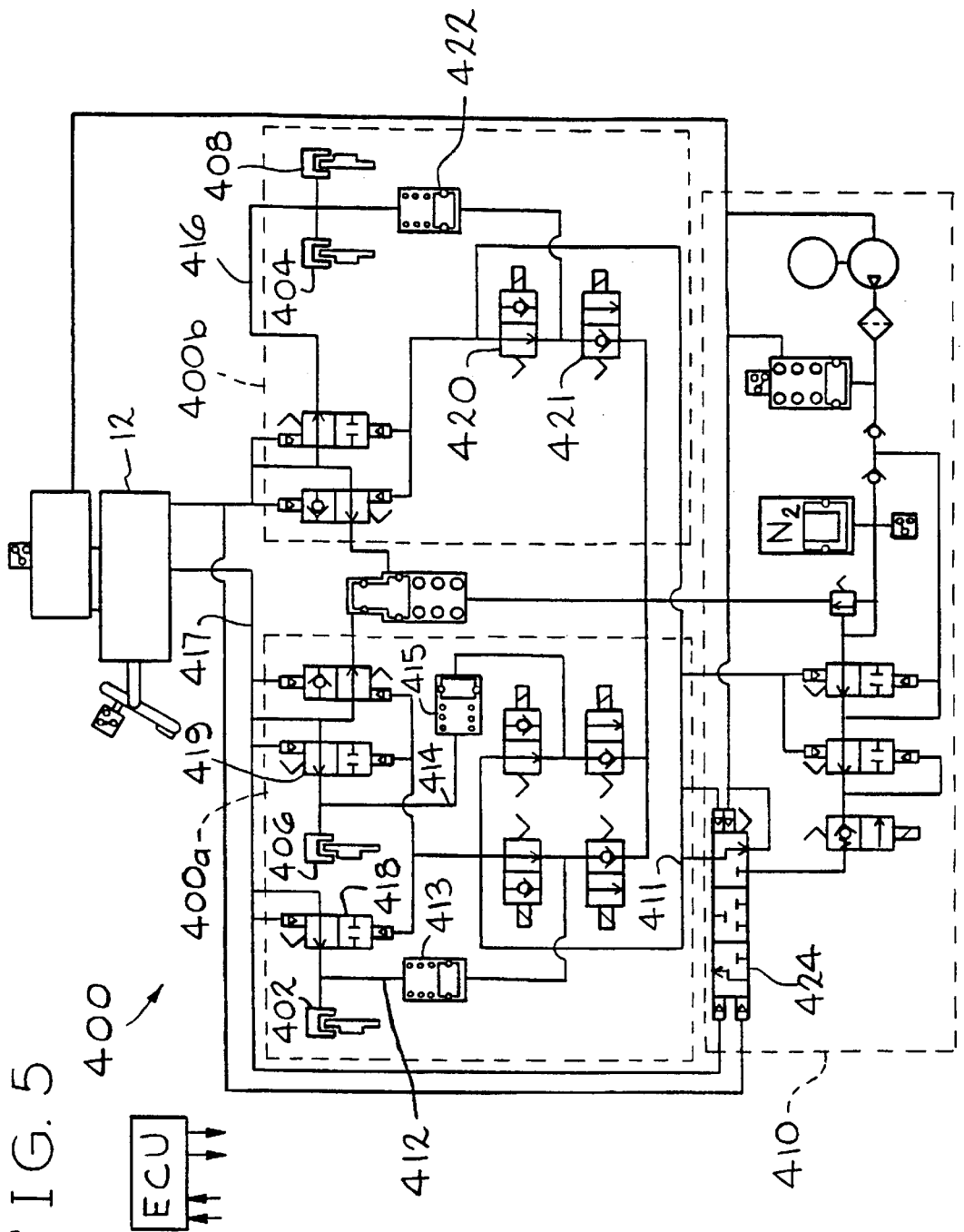
FIG. 5 is a hydraulic schematic of a third embodiment of a brake system in accordance with the present invention.

Referring now to FIG. 5, there is illustrated a third embodiment of a brake system, indicated generally at 400, for providing brake boost, ABS, and dynamic rear proportioning (DRP). The brake system 400 is similar to the brake system 350 of FIG. 4 and includes first and second brake circuits 400*a* and 400*b*. The brake system 400 can be configured as a "Y-split" system such as by connecting a wheel brake 402 to the left front wheel, a wheel brake 404 to the left rear wheel, a wheel brake 406 to the right front wheel, and a wheel brake 408 to the right rear wheel. Note that the rear wheel brakes 404 and 408 of the brake circuit 400*b* are in direct fluid communication with each other.

The term "Y-split" throughout this specification refers to a brake system, such as the brake system 400 of FIG. 5, wherein during normal boosted braking there are separate fluid paths for the wheel brake associated with the left front wheel, the wheel brake associated with the right front wheel, and the combination of the wheel brakes associated with the left rear and right rear wheels. For example, during normal boosted braking of the brake system 400 of FIG. 5, in which a fluid pressure generator circuit 410 is supplying pressurized fluid to a conduit 411, a conduit 412 from a fluid separator 413 supplies fluid to the wheel brake 402, a conduit 414 from a fluid separator 415 supplies fluid to the wheel brake 406, and a conduit 416 supplies fluid from a fluid separator 422 to both the wheel brakes 404 and 408. However, during "manual push through"braking, in which the fluid pressure generator circuit 410 is not introducing pressurized fluid in the conduit 411, a conduit 417 supplies fluid from the master cylinder 12 to the wheel brakes 402 and 406, through open shuttled isolation valves 418 and 419, respectively. Also, during manual push through braking, the conduit 416 supplies fluid to the wheel brakes 404 and 408 from the master cylinder 12.

The brake circuit 400*b* includes a single normally open 2-position, 2-way solenoid operated apply valve 420, a single normally closed 2-position, 2-way solenoid operated dump valve 421, and the single fluid separator assembly 422 all of which are associated with the wheel brakes 404 and 408. Thus, the wheel brakes 404 and 408 are operated concurrently and are not operated individually. As indicated above, the brake system 400 provides "manual push through" to the wheel brakes 402, 404, 406, and 408. The brake system 400 includes a boost valve 424 which operates in a similar manner as the boost valve 70 of the brake system 10 of FIG. 1, except that the illustrated boost valve 424 is not solenoid operated. Thus, the brake system 400 does not provide for TC or VSC braking operations. Of course, it is anticipated that, if desired, the brake system 400 may include a solenoid operated boost valve, such as the boost valve 130 of FIG. 2.

Figure 6:
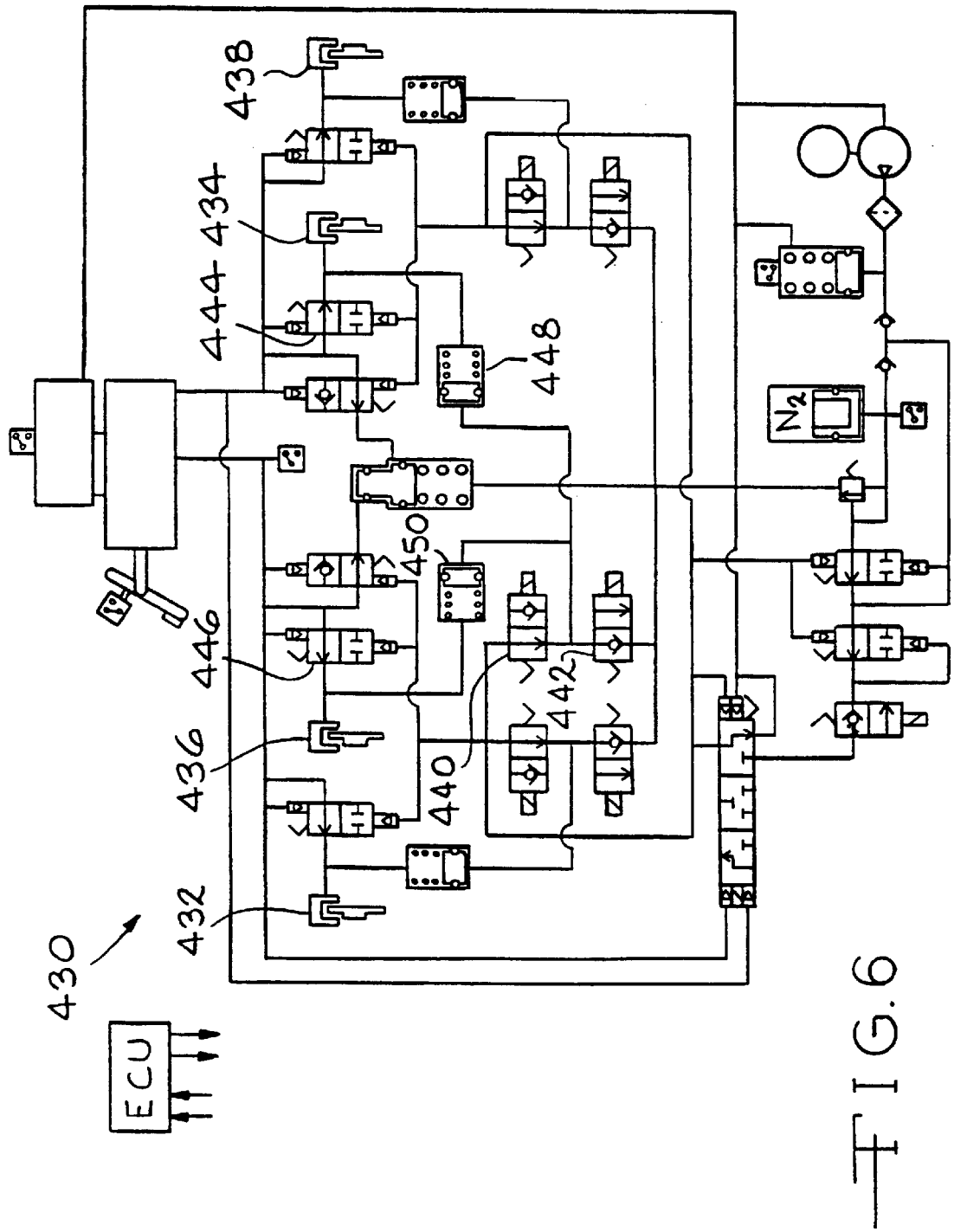
FIG. 6 is a hydraulic schematic of a fourth embodiment of a brake system in accordance with the present invention.

Referring now to FIG. 6, there is illustrated a fourth embodiment of a brake system, indicated generally at 430, for providing brake boost, ABS control, DRP, and TC. The brake system 430 may be configured as a "diagonal split" brake system with respect to manual push through braking such as by connecting a wheel brake 432 to the left front wheel, a wheel brake 434 connected to the left rear wheel, a wheel brake 436 connected to the right rear wheel, and a wheel brake 438 connected to the right front wheel. The brake system 430 can be a "Y-split" system with normal boosted braking, in that the pressure at both of the rear wheel brakes 434 and 436 is controlled by a single normally open 2-position, 2-way solenoid operated apply valve 440, and a single normally closed 2-position, 2-way solenoid operated dump valve 442. Each of the wheel brakes 434 and 436 has a respective isolation valve 444 and 446 and a respective fluid separator assembly 448 and 450.

Figure 7:
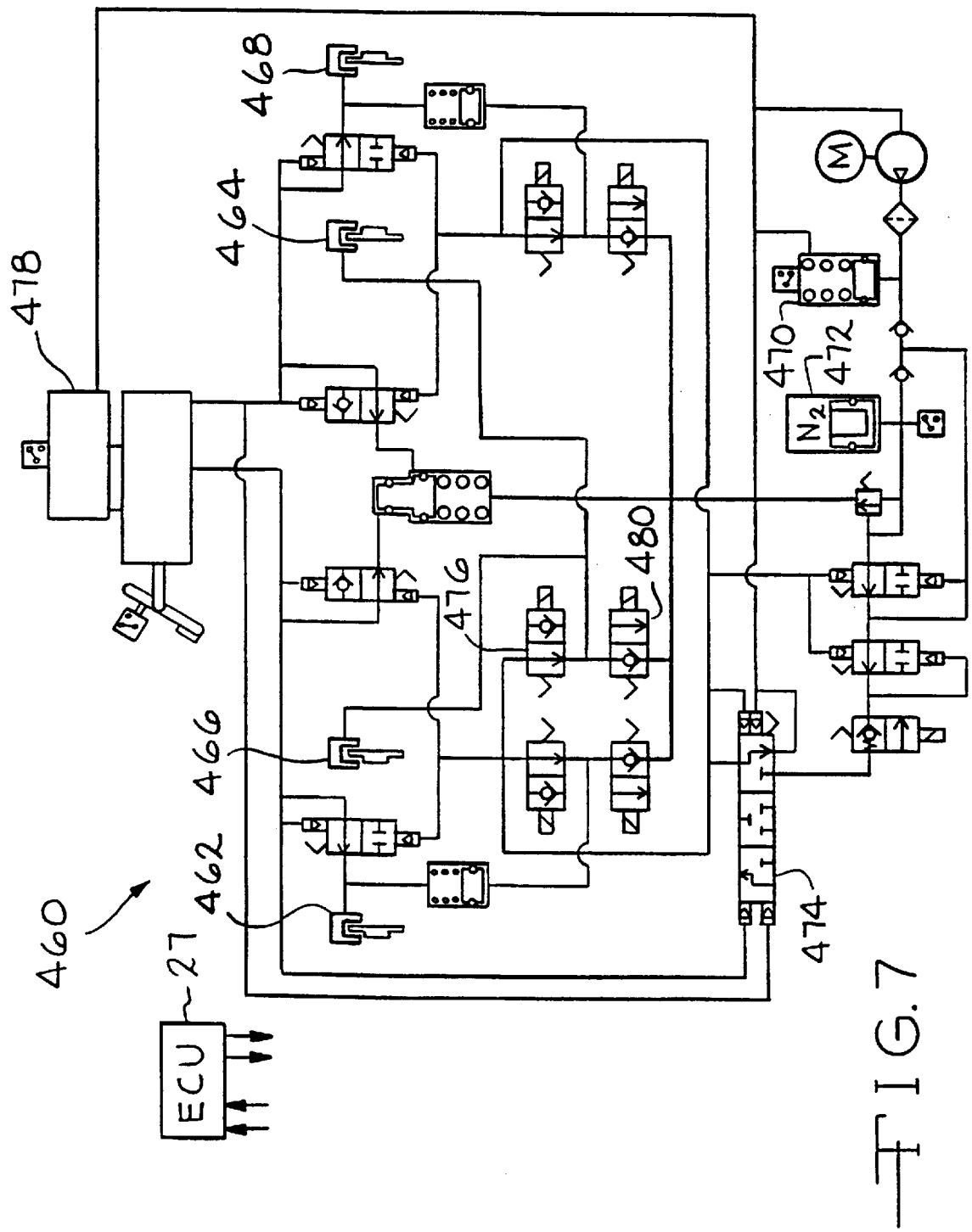
FIG. 7 is a hydraulic schematic of a fifth embodiment of a brake system in accordance with the present invention.

Referring now to FIG. 7, there is illustrated a fifth embodiment of a brake system, indicated generally at 460, for providing brake boost, ABS control, and DRP. The brake system 460 may be configured as a "Y-split" brake system such as by connecting a wheel brake 462 to the left front wheel, a wheel brake 464 connected to the left rear wheel, a wheel brake 466 connected to the right rear wheel, and a wheel brake 468 connected to the right front wheel. In the brake system 460, the rear wheel brakes 464 and 466 do not have associated fluid separators. The brake system 460 also does not have "manual push through" to the rear wheel brakes 464 and 466 because they are not in fluid communication with the master cylinder 12 via an isolation valve.

however, manual push through braking is available to the front wheel brakes 462 and 468, where it will be most effective in retarding forward motion due to weight transfer during braking.

The braking pressure at the front wheel brakes 462 and 468 is controlled in a similar manner as the circuit 10a of the brake system 10 of FIG. 1. In contrast, the rear wheel brakes 464 and 466 are pressurized during normal boosted braking with pressurized fluid from the medium and high pressure accumulators 470 and 472 which flows through a boost valve 474 and a normally open apply valve 476. Upon brake release, the pressurized fluid from the rear wheel brakes 464 and 466 flows back through the boost valve 474 and returns to a reservoir 478. During ABS and DRP braking operations, pressurized fluid is applied to the rear wheel brakes 464 and 466 through the apply valve 476 and dumped from the rear wheel brakes 464 and 466 through a dump valve 480.

Figure 8:
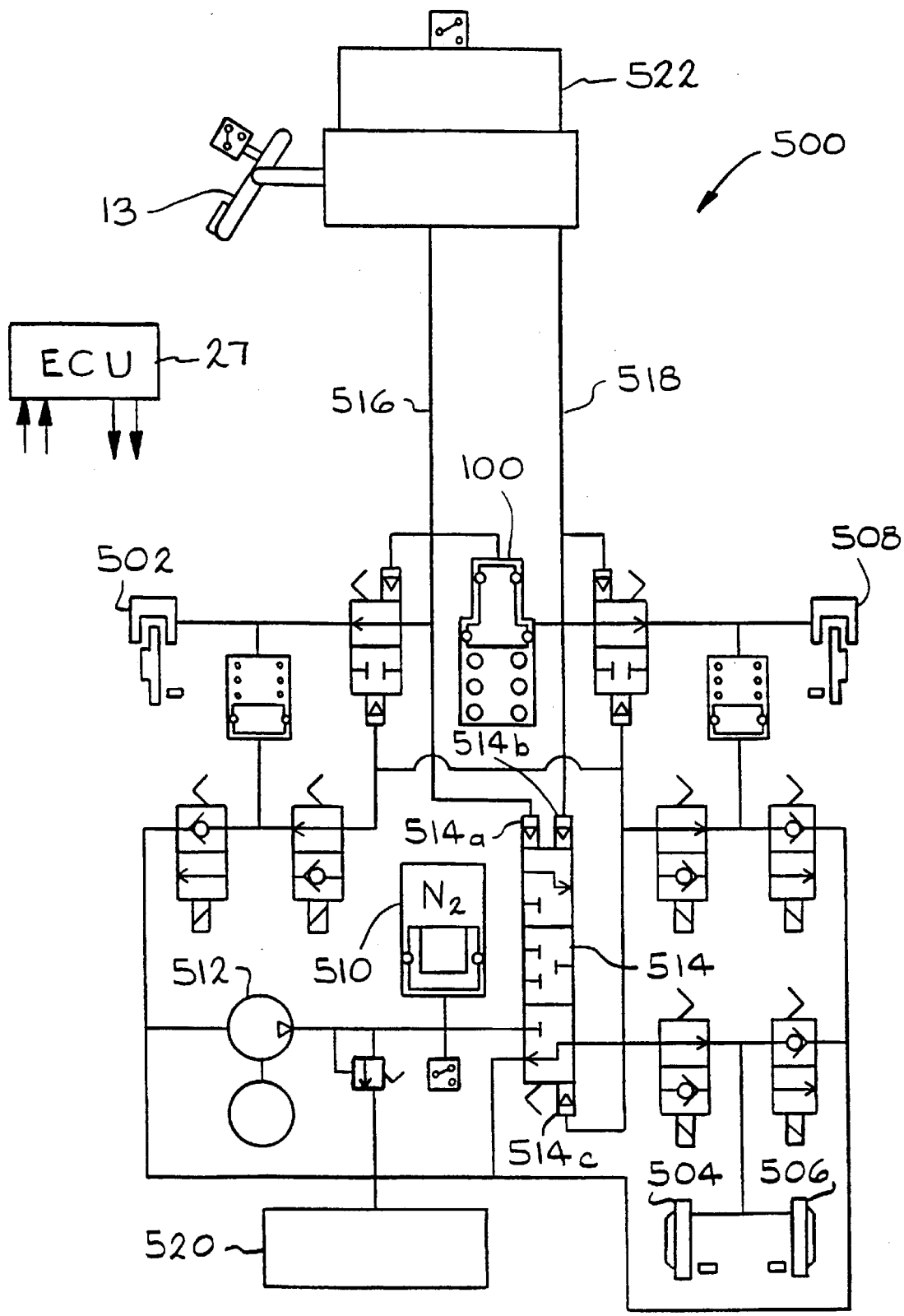
FIG. 8 is a hydraulic schematic of a sixth embodiment of a brake system in accordance with the present invention.

Referring now to FIG. 8, there is illustrated a sixth embodiment of a brake system, indicated generally at 500, for providing brake boost, ABS control, and DRP. The brake system 500 may be configured as a "Y-split" brake system such as by connecting a wheel brake 502 to the left front wheel, a wheel brake 504 to the left rear wheel, a wheel brake 506 to the right rear wheel, and a wheel brake 508 to the right front wheel. The brake system 500 has "manual push through" only to the front wheel brakes 502 and 508. The brake system 500 includes a single high pressure accumulator 510 for storage of pressurized fluid generated by a pump 512.

A pilot-operated boost valve 514 is operatively shuttled when the fluid pressure within a pair of fluid conduits 516 and 518, via control ports 514a and 514b, respectively, exceed the pressure level downstream of the boost valve 514 at a control port 514c divided by the boost ratio. Although the illustrated boost valve 514 does not include a solenoid, the boost valve may include a solenoid to provide TC and limited VSC braking operation. Note that the brake system 500 does not include a pressure regulator valve or a boost enable valve. The boost valve 514 is consequently constructed to operate with a relatively large pressure differential across the boost valve 514. Also, the brake system 500 does not include pedal travel simulator shut-off valves. The brake pedal 13 and master cylinder 12 are, therefore, constructed to enable the driver to supply sufficient pressurized fluid to the front wheel brakes 502 and 508 for a desired minimum amount of braking even with a portion of the fluid from the master cylinder 12 being directed into the pedal travel simulator 100 instead of the front wheel brakes 502 and 508.

Note that the portion of the pedal travel simulator 100 containing the spring may be vented to the reservoir 522 via a conduit (not shown) or may be vented to atmosphere (not shown) or any other suitable venting arrangement.

Note also that the pump 512 draws fluid from a reservoir 520 which may be separate from a reservoir 522 for the master cylinder 12. This may be desirable from a packaging standpoint, and a similar arrangement may be provided for any embodiment of brake system according to the invention described herein.

Figure 9:
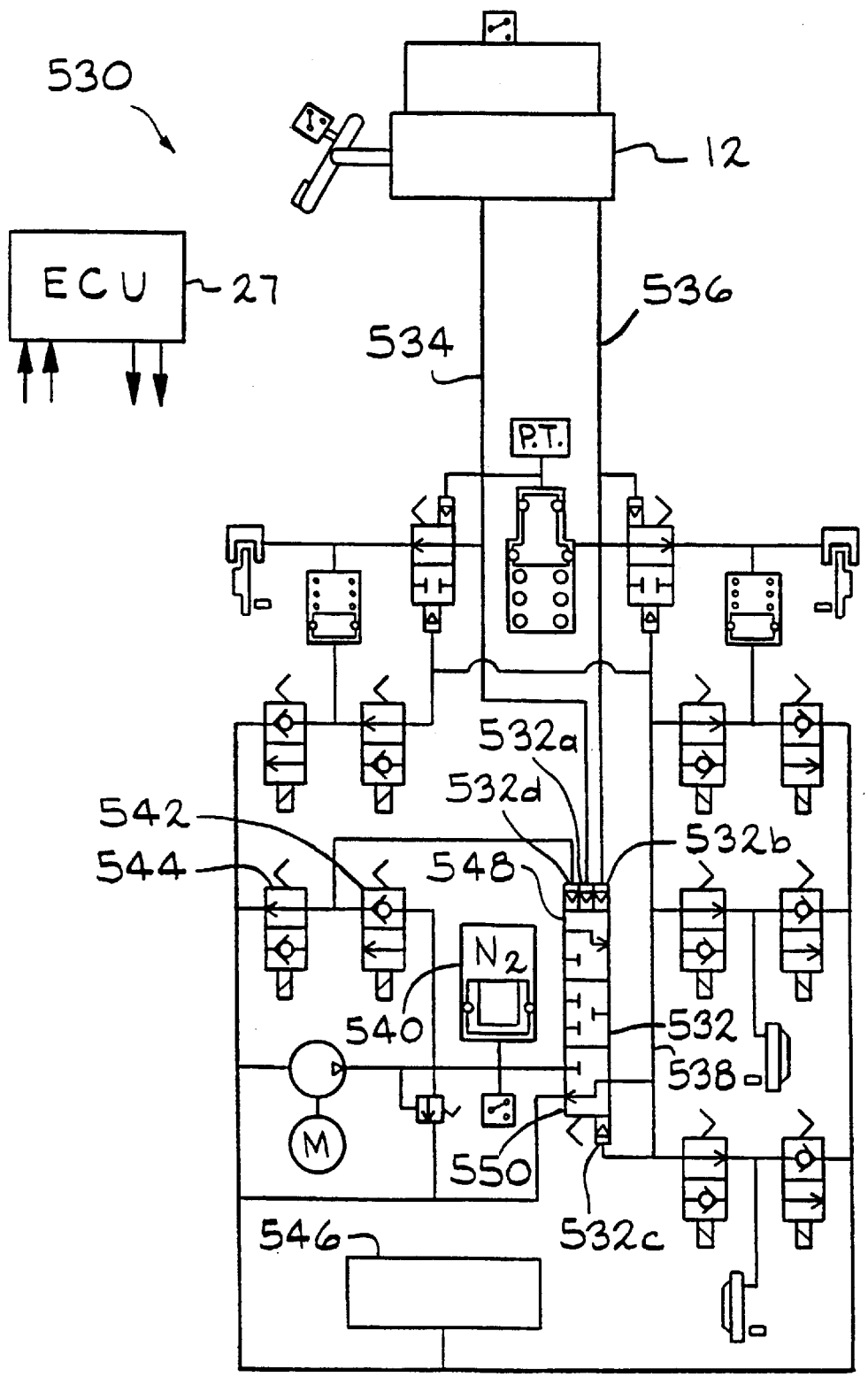
FIG. 9 is a hydraulic schematic of a seventh embodiment of a brake system in accordance with the present invention.

Referring now to FIG. 9, there is illustrated a seventh embodiment of a brake system, indicated generally at 530, for providing brake boost, ABS control, DRP, TC and VSC. The brake system 530 is similar to the brake system 500 of FIG. 8. Although the brake system 530 includes a boost valve 532 which is not solenoid actuated, the brake system 530 can provide TC and VSC braking operation. The boost valve 532 has pressure control ports 532a and 532b in fluid communication with fluid conduits 534 and 536, respectively, which connect the master cylinder 12 to first and second brake circuits. The boost valve has a control port 532c in fluid communication with a supply conduit 538, located downstream of the boost valve 532. Unlike the brake system 500 of FIG. 8, the brake system 530 includes a fourth control port 532d for shuttling the boost valve 532 during a TC or VSC braking operation by referencing pressurized fluid from a high pressure accumulator 540. A normally closed 2-position, 2-way solenoid operated dump apply 542 is fluidly located between the high pressure accumulator 540 and the pressure control port 532d. A normally open 2-position, 2-way solenoid operated dump valve 544 is fluidly located between the pressure control port 532d and a reservoir 546. When the apply valve 542 is moved to an open position and the dump valve 544 is moved to a closed, one-way position, the pressure at the control port 532d rises to shuttle the boost valve 532 to a pressure increasing position 548. At the position 548, the boost valve 532 admits pressurized fluid from the high pressure accumulator 540 into the supply conduit 538. The apply and dump valves 542 and 544, in cooperation with isolation valves and dump valves associated with each wheel brake, are actuated to regulate the pressure at the wheel brakes to achieve TC and VSC braking control. To shuttle the boost valve 532 back to a pressure decreasing position 550, the apply valve 544 is moved to a closed, one-way position and the dump valve 544 is moved to an open position to allow the pressurized fluid at control port 532d to return to the reservoir 546. To move the boost valve 532 to a pressure hold position 549 from the pressure decreasing positions, the apply valve 542 is momentarily energized and the dump valve 544 deenergized. When the boost valve 530 is moved to the pressure hold position 549, the apply valve 542 is shut, hydraulically locking the boost valve 532 in place.

Figure 10:
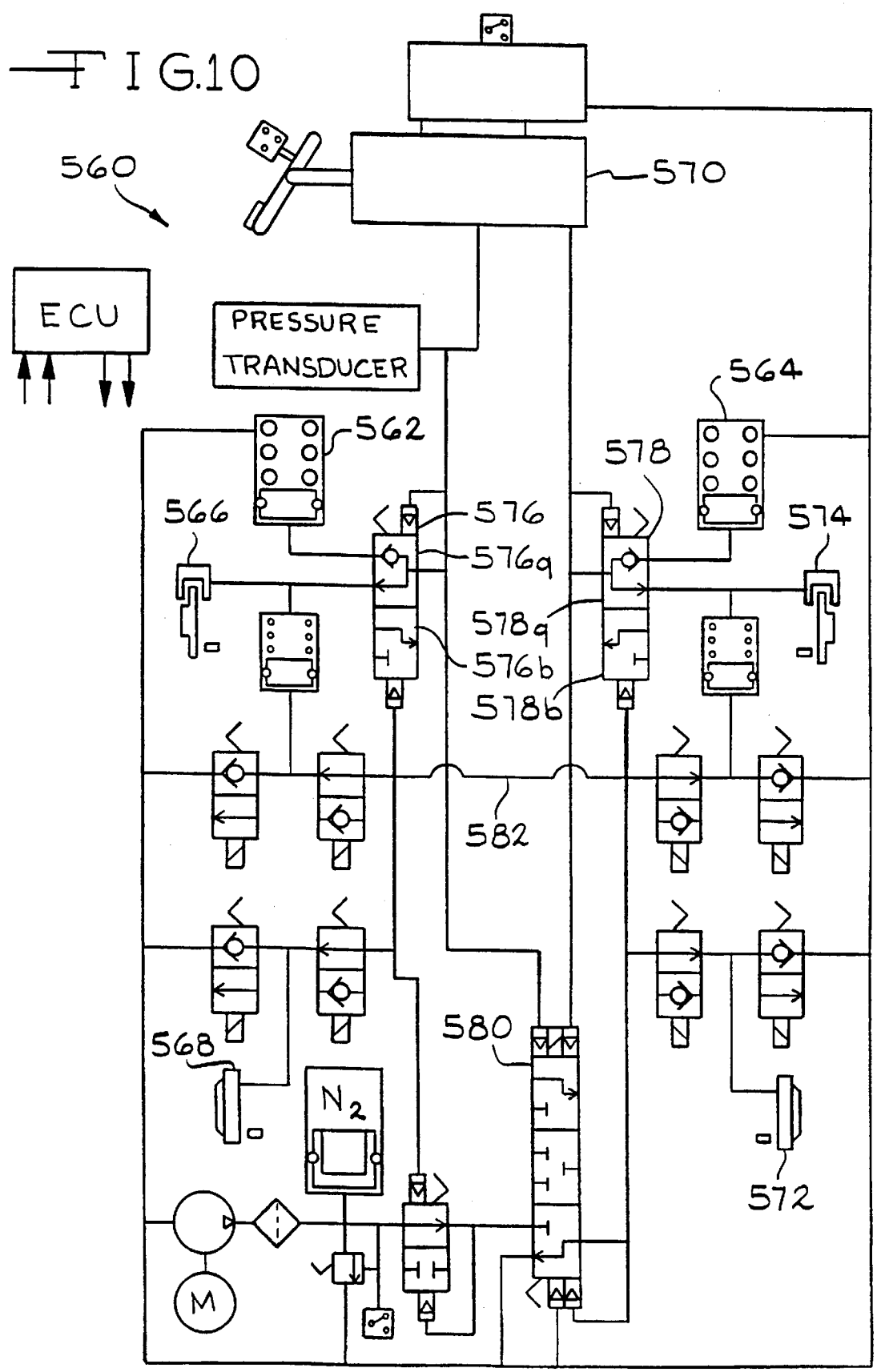
FIG. 10 is a hydraulic schematic of an eighth embodiment of a brake system in accordance with the present invention.

Referring now to FIG. 10, there is illustrated an eighth embodiment of a brake system, indicated generally at 560, for providing ABS control, DRP, TC, and VSC. The brake system 560 includes two separate pedal travel simulators 562 and 564. The pedal travel simulator 562 is used to simulate adequate pedal feel when a wheel brake 566 is isolated from a master cylinder 570. The pedal travel simulator 564 is used to simulate adequate pedal feel when wheel brake 574 is isolated from the master cylinder 570. A pair of two position, three way isolation/pedal travel simulator shut-off valves 576 and 578 are fluidly connected between the master cylinder 570 and the wheel brakes 566 and 574, respectively. The valves 576 and 578 have first positions 576a and 578a which allow fluid to flow from the master cylinder 570 to the wheel brakes 566 and 574, respectively, while preventing fluid from flowing into the pedal travel simulators 562 and 564. The valves 576 and 578 have second positions 576b and 578b, respectively, which allow fluid to flow from the master cylinder 570 to the pedal travel simulators 562 and 564 while preventing fluid from flowing into the wheel brakes 566 and 574, respectively. The brake system 560 provides "manual push through" to the wheel brakes 566 and 574 when the pressure supplied from the master cylinder 520 is greater than the pressure supplied from a boost valve 580 in a supply conduit 582. Note that the brake system 560 does not include a boost enable valve.

Figure 11:
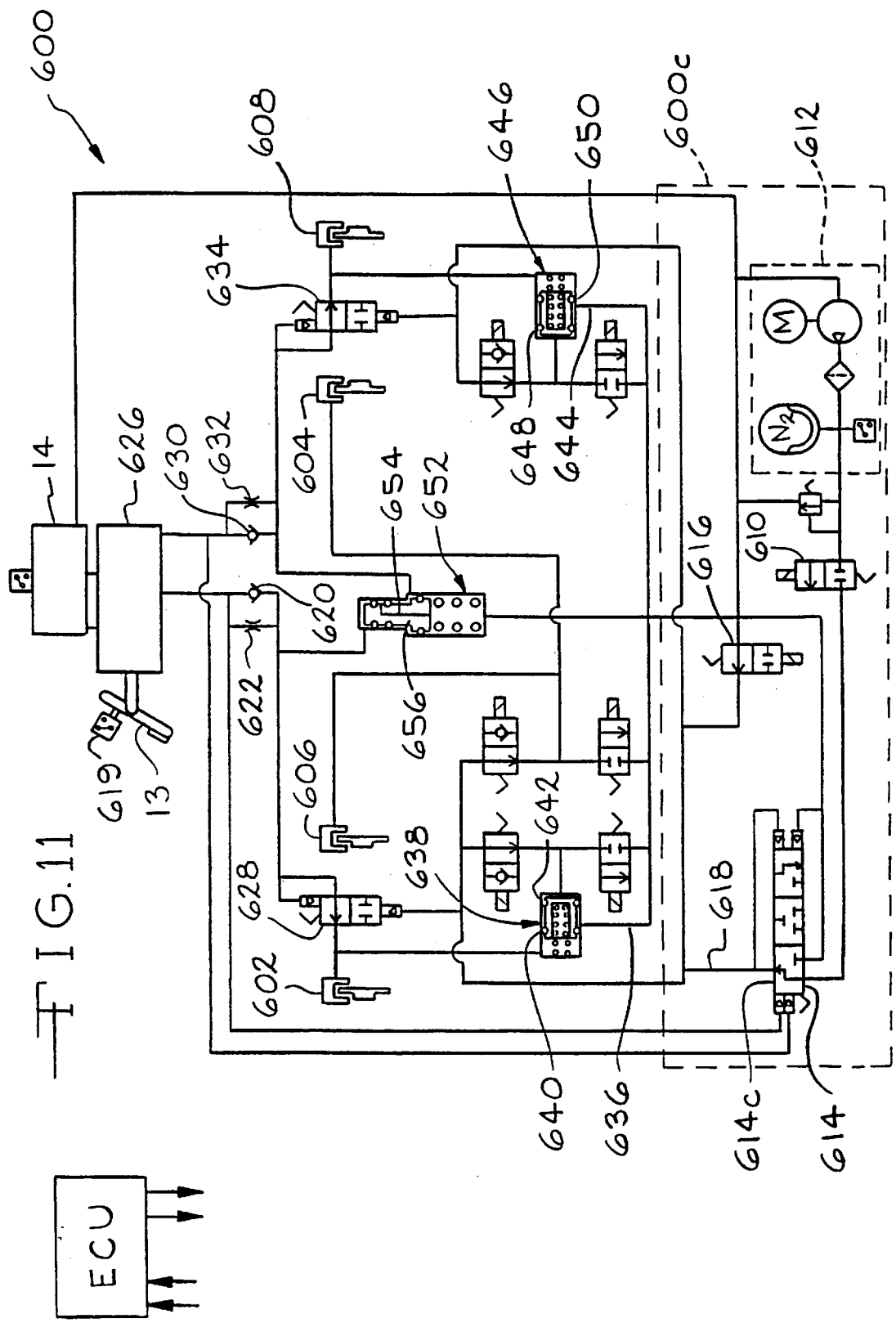
FIG. 11 is a hydraulic schematic of an ninth embodiment of a brake system in accordance with the present invention.

Referring now to FIG. 11, there is illustrated a ninth embodiment of a brake system, indicated generally at 600, for providing brake boost, ABS control, and DRP. The brake system 600 may be configured as a "Y-split" brake system such as by connecting a wheel brake 602 to the left front wheel, a wheel brake 604 to the left rear wheel, a wheel brake 606 to the right rear wheel, and a wheel brake 608 to the right front wheel. The brake system has a "manual push through" only to the wheel brakes 602 and 608.

The brake system 600 includes a fluid pressure generator circuit 600c having a boost enable valve 610 hydraulically positioned between a source of pressurized fluid 612 and a boost valve 614. The boost valve 614 is spring biased to a pressure increasing position 614c which generally corresponds to the position 70c of the boost valve 70 of the brake system 10 of FIG. 1. Because the boost valve 614 is biased by a spring force to the pressure increasing position 614c, the brake system 600 preferably, includes a normally open valve 616 to relieve a build up of pressure in a conduit 618 from the boost valve 614 shortly after a normal boosted braking operation has been completed. During normal boosted braking, the valve 616 is actuated to a closed position to prevent the flow of fluid from the boost valve 614 to the reservoir 14. After the operator of the vehicle releases the brake pedal, and the boost valve is shuttled to the position 614c, the valve 616 is actuated to its open position to relieve any build up of pressure within the conduit 618.

The brake system 600 can be configured so that as soon as the driver of the vehicle depresses the brake pedal 13, as sensed by a brake switch 619, the boost enable valve 610 and the valve 616 can be actuated to respective open and closed positions so that fluid pressure can be applied to the wheel brakes relatively quickly. Thus, as soon as the driver depresses the brake pedal 13, the driver can sense that pressure is applied to the wheel brakes. In other words, the pressure that is required to initially operate the brake system 600 during normal boosted braking in the embodiments of the brake systems according to the present invention described above, such as shuttling various piloted valves and actuating the boost valve 614, can effectively be "subtracted" from compensated.

The brake system 600 further includes a check valve 620 and an orifice 622 in a parallel arrangement between a master cylinder 626 and a piloted isolation valve 628 associated with the wheel brake 602. Similarly, a check valve 630 and an orifice 632 are in a parallel arrangement between the master cylinder 626 and an isolation valve 634 associated with the wheel brake 608. The check valves 620 and 630 cooperate with the orifices 622 and 632, respectively, to hydraulically restrict the flow of fluid from the master cylinder 626 to the isolation valves 628 and 634, respectively. Thus, during a sudden hard brake apply, the check valves 620 and 630 are shut, and the orifices 622 and 632 will help prevent an excess of fluid from entering the wheel brakes 602 and 608 prior to the isolation vales 628 and 634 shuttling to their closed positions. The orifices 622 and 632 also provide a damped pedal feel which the driver experiences via the brake pedal as the fluid is restrictively flowing through the orifices 622 and 632. When the driver releases the brake pedal 13, fluid can freely flow through the check valves 620 and 630 back to the master cylinder 626.

The brake system 600 further includes a conduit 636 providing fluid communication between the reservoir 14 and a fluid separator 638 between a pair of axially spaced seals 640 and 642 disposed circumferentially about the piston of the fluid separator 638. The conduit 636 enables the brake system 600 to detect if a failure has occurred in one of the seals 640 or 642 in the fluid separator 638. Failure is detected by means of sensors (not shown) which detect leakage flow past the seals 640 and 642 into the conduit 636. Similarly, the brake system 600 includes a conduit 644 in fluid communication with the reservoir 14 and a fluid separator 646 between a pair of axially spaced seals 648 and 650 disposed circumferentially about the piston of the fluid separator 646. The brake system 600 further includes a pedal simulator 652 having a passageway 654 formed through a piston 656 which can be monitored to provide detection of a failed seal in the pedal simulator 652.

Figure 12:
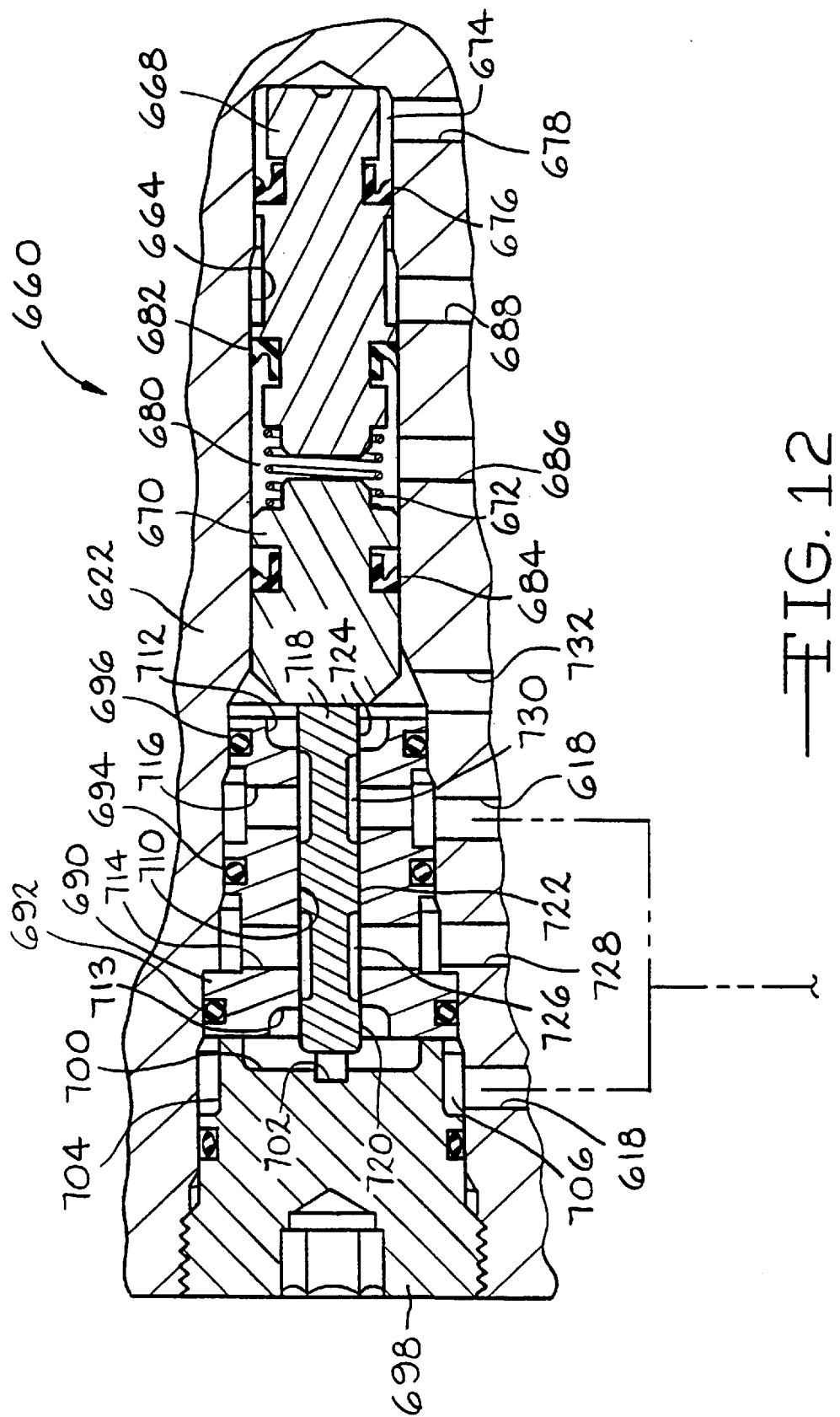
FIG. 12 is a sectional view of a second embodiment of a boost valve in accordance with the present invention.

Referring now to FIG. 12, there is illustrated a second embodiment of a boost valve, indicated generally at 660, which can be used as the boost valve 614 of the brake system 600 of FIG. 11. The boost valve 660 will be described in cooperation with the brake system 600 of FIG. 11. The boost valve 660 is a spool valve design. The boost valve 660 is similar in function and structure to the boost valve 130 of FIG. 2. The boost valve 660 includes a housing 662 having a bore 664 formed therein. A first piston 668 and a second piston 670 are disposed within the bore 664. A spring 672 biases the first and second pistons 668 and 670 away from each other. The boost valve 660 includes a first chamber 674 at the right-hand end, as viewing FIG. 12, which is generally defined by the housing 622, the bore 664, the first piston 668, and a seal 676 seated about the first piston 668 which seals against the first piston 668 and the surface of the housing 622 defining the bore 664. The first chamber 674 is in fluid communication with the master cylinder 626 via a port 678. A second chamber 680 is generally defined by the surface of the housing 662 defining the bore 664, the first and second pistons 668 and 670, a second seal 682 seated about the first piston 668 which seals against the first piston 668 and the surface of the housing 622 defining the bore 664, and a seal 684 seated about the second piston 670 which similarly seals against the second piston 670 and the housing 622. The second chamber 680 is in fluid communication with the master cylinder 626 via a port 686. A passageway 688 is formed in the housing 622 which is in fluid communication with the reservoir 14 and the annular chamber defined by the bore 664 about the is first piston 668bbetween the seals 676 and 682 of the first piston 668. The passageway 688 enables the driver to detect a failure in one of the seals 676 and 682 by means of a pedal drop which means a detector which senses a leakage flow past the seal 676 or 682.

The boost valve 660 further includes a sleeve 690 disposed in the bore 664 of the housing 622. An axially spaced set of seals 692, 694, and 696 sealingly engage the sleeve 690 and the housing 622. The sleeve 690 is retained in the housing 622 by an end plug 698 fixably attached to the housing 622, thereby sealing off the opening as the left-hand end, as viewing FIG. 12, of the bore 664. The end plug 698 has an cylindrical recess 700 formed at the end facing the sleeve 690. The end plug 698 also has a radial slot 702 formed therethrough which is in fluid communication with the cylindrical recess 700. The end plug 698 includes a small diameter portion 704 which defines an annular cavity 706 between the small diameter portion 704 and the bore 664 of the housing 622. The annular cavity 706 is in fluid communication with the radial slot 702 and a conduit, such as the conduit 618 of the brake system 600. The sleeve 690 has an axial bore 710 formed therethrough. The sleeve 690 has a pair of radial slots 712 and 713 formed at the opposite ends thereof which are in fluid communication with the axial bore 710. The sleeve 690 also has a pair of transverse passageways 714 and 716 formed therethrough which are each in fluid communication with the axial bore 710 and the bore 664 of the housing 622.

Disposed within the axial bore 710 is a spool 718 having first, second, and third lands 720, 722, and 724. An annular first chamber 726 is defined by the axial bore 710 and the spool 718 between the first and second lands 720 and 722.

The first chamber 726 is in fluid communication with a source of pressurized fluid 612 via with the transverse passageway 714 and a conduit 728 formed in the housing 622. An annular second chamber 730 is defined by the axial bore is 710 and the spool 718 between the second and third lands 722 and 724. The second chamber 730 is in fluid communication with the transverse passageway 716 and a supply conduit, such as the conduit 618 of the brake system 600. A conduit 732 is formed in the housing 622 which is in fluid communication with the slot 712 and the reservoir 14. Note that the boost valve 660 does not have a solenoid.

The operation of the boost valve 660 will now be described in cooperation with the brake system 600 of FIG. 11. Normally, when the master cylinder 626 is not generating pressurized fluid to the conduits 678 and 686, the spool 718 is positioned so that the first land 720 exposes the radial slot 713, thereby permitting fluid communication between the conduit 728 and the conduit 618. This positioning corresponds to the position 614c of the boost valve 614 of the brake system 600. During normal boosted braking when the driver depresses the brake pedal, the boost enable valve 610 is actuated to the open position permitting the flow of fluid from the conduit 728 through the first annular chamber 726 to the conduit 618. The pressure acting on the left-hand end of the spool 718 will bias the spool 718 rightward, as viewing FIG. 12, to restrict the flow of fluid from the conduit 728 to the conduit 618. Pressurized fluid from the master cylinder 626 via the conduits 678 and 686, causes the second piston 670 to move leftward, as viewing FIG. 12. Depending on various factors such as the diameters of the first piston 668, the second piston 670, and the spool 718, the spool 718 will be positioned so as to correspond with the schematical position of the boost valve 614 illustrated in FIG. 11, to maintain a desired pressure boost ratio within the conduit 618 with respect to the pressure generated by the master cylinder 626, as generally described above with respect to the boost valve 130.

To decrease pressure applied to the wheel brakes 602, 604, 606, and 608 via the conduit 68, the driver releases the brake pedal 13. This lowers the pressure in the conduits 678 and 686, allowing the second piston 670 to move rightward, as viewing FIG. 12, under the urging of the pressure applied from the supply conduit 618 acting on the spool 718, which drives the piston 670 rightward also. The spool 718 thus moves to a pressure decreasing position permitting fluid communication between the supply conduit 618 and the reservoir 14 via the conduit 732. In a pressure hold situation, the spool 718 is driven by hydraulic forces to a mid-position preventing fluid communication between the first annular chamber 726 and either the supply conduit 718 or the reservoir 14 via the conduit 732.

Figure 13:
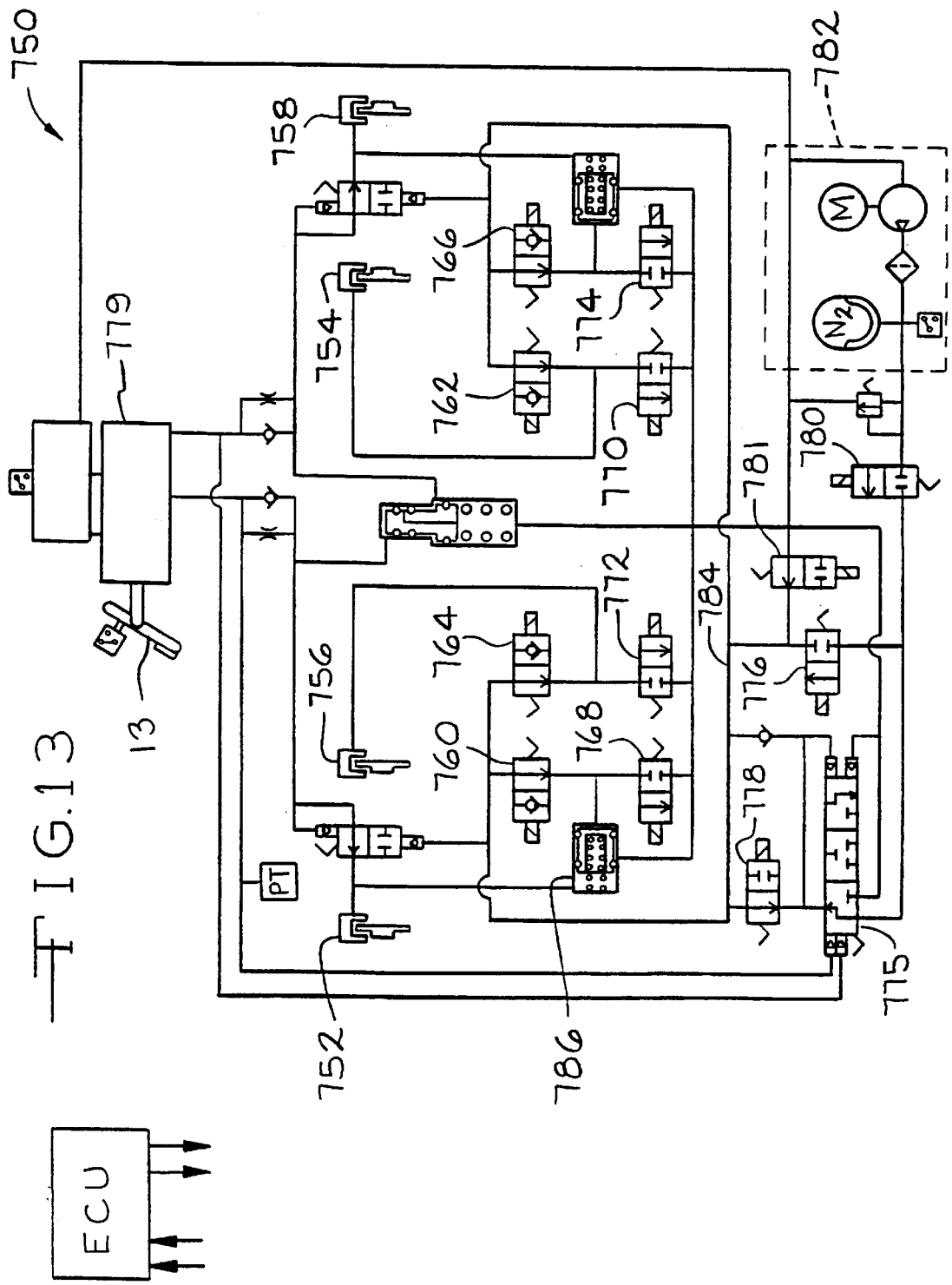
FIG. 13 is a hydraulic schematic of a tenth embodiment of a brake system in accordance with the present invention.

Referring now to FIG. 13, there is illustrated a tenth embodiment of a brake system, indicated generally at 750, for providing brake boost, ABS control, DRP, TC, and VSC. Preferably, the brake system 750 is configured such that a wheel brake 752 is associated with the left front wheel, a wheel brake 754 is associated with the left rear wheel, a wheel brake 756 is associated with the right rear wheel, and a wheel brake 758 is associated with the right front wheel. In this configuration, the brake system 750 provides "manual push through" to the wheel brakes 752 and 758 which are associated with the front wheels. The brake system 750 is similar to the brake system 600 of FIG. 11. However, the brake system 750 includes apply valves 760, 762, 764, and 766 and dump valves 768, 770, 772, and 774, associated with the wheel brakes 752, 754, 756, and 758, respectively. The brake system 750 includes a boost valve 775 for controlling wheel brake pressure in response to the driver's actuation of the brake pedal 13 in a manner similar to the boost valve 614 of the brake system 600 of FIG. 11, that is, as a purely pilot-operated boost valve. The boost valve 774 has not solenoid.

However, the brake system 750 also includes first and second boost control valves 776 and 778 to operate the boost valve 775 to provide pressurized fluid to the brake system 750 regardless of whether the master cylinder 779 has been actuated, such as for TC and VSC operations. For example, if it is desired for TC purposes to apply a braking force to the wheel brake 752, a driver would not be operating the brake pedal 13, and the boost valve would not be operated. In this case, a boost enable valve 780 is actuated to an open position, and a normally open valve 781 is actuated to a closed position. The valve 781 is similar in structure and function to the valve 616 of the brake system 600. The first boost control valve 776 is also actuated to an open position, and the second boost control valve 778 is actuated to a closed position so that pressurized fluid from a source of pressurized fluid 782 flows into a conduit 784. The apply valves 762, 764, and 766 are actuated to a respective closed position to prevent fluid from the conduit 784 from actuating the wheel brakes 754, 756, and 758, respectively. Thus, pressurized fluid can flow from the conduit 784, through the apply valve 760, and pressure is transmitted through a fluid separator 786 to actuate the wheel brake 752. The apply valve 760 and the dump valve 768 can then be cyclically operated to regulate the pressure at the wheel brake 752.

Figure 14:
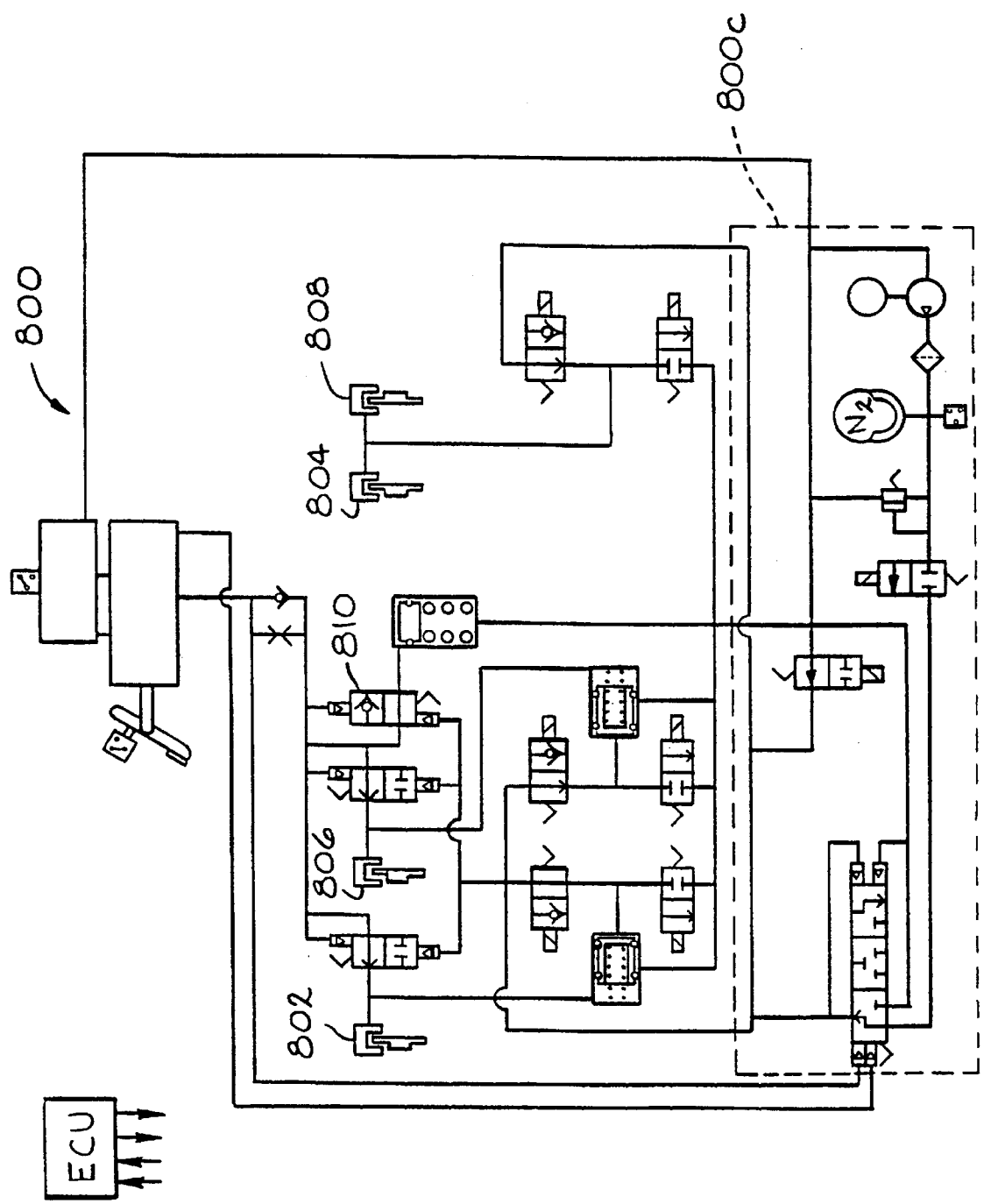
FIG. 14 is a hydraulic schematic of an eleventh embodiment of a brake system in accordance with the present invention.

Referring now to FIG. 14, there is illustrated an eleventh embodiment of a brake system, indicated generally at 800, for providing brake boost and ABS control. The brake system 800 may be configured as a "vertically split" brake system such as by connecting a wheel brake 802 to the left front wheel, a wheel brake 804 to the left rear wheel, a wheel brake 806 to the right front wheel, and a wheel brake 808 to the right rear wheel. The brake system has a "manual push through" only to the wheel brakes 802 and 806. The brake system 800 includes a fluid pressure generator circuit 800c which is similar to the fluid pressure generator circuit 600c of the brake system 600 of FIG. 11. Preferably, the brake system 800 includes a pedal travel simulator shut-off valve 810 which functions similarly to the pedal travel simulator shut-off valve 124 of the brake system 10 of FIG. 1.

Figure 15:
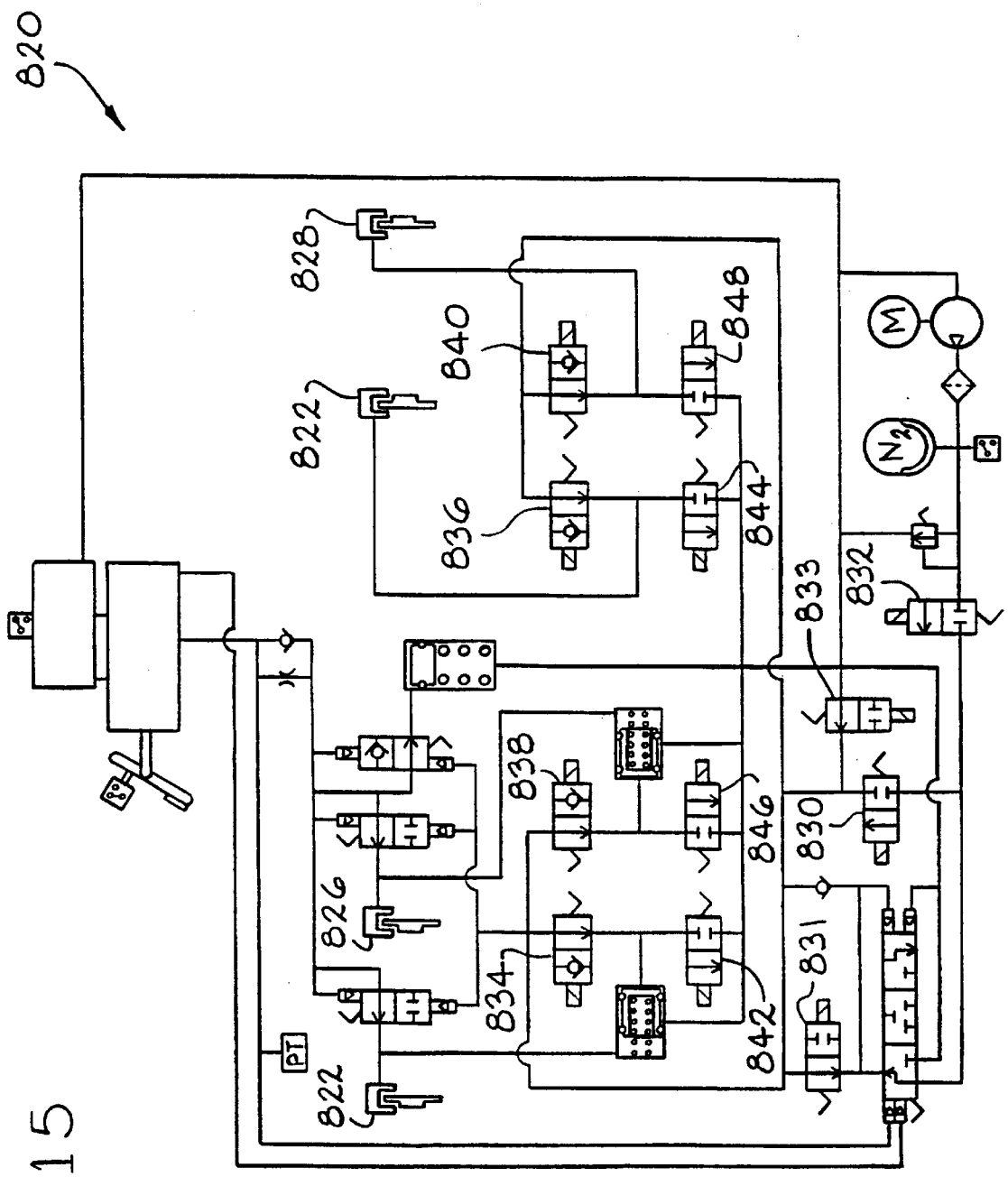
FIG. 15 is a hydraulic schematic of a twelfth embodiment of a brake system in accordance with the present invention.

Referring now to FIG. 15, there is illustrated a twelfth embodiment of a brake system, indicated generally at 820, for providing brake boost, ABS control, DRP, TC, and VSC. The brake system 820 is similar to the brake system 800 and may be configured as a "vertically split" brake system such as by connecting a wheel brake 822 to the left front wheel, a wheel brake 824 to the left rear wheel, a wheel brake 826 to the right front wheel, and a wheel brake 828 to the right rear wheel. The brake system 820 has a "manual push through" only to the front wheel brakes 822 and 826. The brake system 820 is also similar in function to the brake system 750 of FIG. 13, in that the brake system 820 has first and second boost control valves 830 and 831, a boost enable valve 832, a normally open valve 833, apply valves 834, 836, 838, and 840, and dump valves 842, 844, 846, and 848 associated with the wheel brakes 822, 824, 826, and 828, respectively.

Referring to FIG. 16, there is illustrated a first embodiment of a piloted isolation valve, indicated generally at 850, which can be used as the isolation valves 26 or 28 of the brake system 10 of FIG. 1. The isolation valve 850 includes a housing 852 having a bore 854 formed therein. Disposed within the bore 854 is a plug 856. A plurality of axially spaced elastomeric seals 857, 858, 959, and 860 are circumferentially disposed about the plug 856, and sealingly engage the plug 856 and the wall of the housing 852 defining the bore 854. The plug 856 is retained in the bore 854 by a circlip 862 and a wave spring 863. The plug 856 has an axial bore 864 formed therein. First, second, and third radial passageways 866, 867, 868 are formed from the outer surface of the plug 856 to the bore 86 so as to be in fluid communication with the axial bore 864. The first radial passageway 866 is in fluid communication with a conduit 870 formed in the housing 852. The second radial passageway 867 is in fluid communication with a conduit 871 formed in the housing 852. The third radial passageway 868 is in fluid communication with a conduit 872 formed in the housing 852. The housing has a conduit 873 formed therein which is in fluid communication with the right-hand end, as viewing FIG. 16, of the opening of the axial bore 864 in the plug 856.

Slidably disposed within the axial bore 864 is a poppet, indicated generally at 876. The poppet 876 includes a plunger 877 having a bore 878 formed axially therethrough. A pair of axially spaced elastomeric seals 879 and 880 are disposed about the plunger 877 and are sealingly engaged with the surface of the bore 864 and a small diameter portion 878a of the portion of the plunger 877 defining an axial bore 865. The second radial passageway 867 is in fluid communication with the conduit 871, which in turn, is in fluid communication with the reservoir 14. The second radial passageway 867 provides means for detecting if one of the seals 879 or 880 fails and fluid leakage occurs past the failed seal. For example, as described with respect to the isolation valve 26 of the brake system 10 of FIG. 1, a leakage occurs past the seal 879, the motor 54 for the pump 52 will actuate an abnormally large amount of time to charge the high pressure accumulator 60. Fluid will leak past the seal 879 from the conduit 36 to the reservoir 14. Thus, the ECU 27 can be programmed to sense the abnormal running of the motor 54 and trigger an alert indicator of a possible malfunction. If a leakage occurred past the seal 880 and the brake system 10 was operating under a normal boosted braking operation, the driver may notice a loss in vehicle deceleration. The loss in vehicle deceleration is due to fluid leaking past the seal 880 from the fluid separator 32 via the conduit 36 to the reservoir when the fluid separator 32 bottomed out. If a leakage occurred past the seal 880 and the brake system 10 was operating under manual push through operation, the driver would experience an increase in the brake pedal travel due to fluid leaking past the seal 880 from the master cylinder 12 via the conduit 24 to the reservoir 14. Of course, the pair of seals 879 and 880 can be replaced with any suitable seal arrangement, such as a single O-ring and without the second radial passageway 867 in fluid communication with the reservoir.

The poppet 876 further includes a valve sealing member, such as a ball 882, fixably retained in the bore 878 of the plunger 877, such as by a press-fit. The ball 882 is press-fit into the bore 878 such that the ball permanently seats against a shoulder 883 formed in the bore 878 of the plunger 877. A radial passageway 884 is formed through the plunger 877 and is in fluid communication with the bore 878 and the third radial passageway 868.

An end plug 885 is fixably attached in the end of the bore 864 of the plug 856. Preferably, the end plug 885 is fixably attached in the bore 864 by a threaded connection so that the end plug 865 can be easily positioned at a relatively close distance to the ball 882. An elastomeric seal 888 is seated about the end plug 885 and sealingly engages the wall of the bore 864 of the plug 856. The end plug 885 has a bore 890 formed therethrough. The bore 890 is in fluid communication with the conduit 873. A valve seat 891 is formed at the opening of the left-hand end of the bore 890, as viewing FIG. 16. A spring 892 disposed in the bore 890 biases the ball 882 of the poppet 876 away from the valve seat 891. The valve seat 891 and the ball 882 cooperate to restrict the flow of fluid between the conduits 873 and 872. An optional fluid filter 893 may be disposed in the bore 890.

The operation of the isolation valve 850 shall now be described as being used as the isolation valve 26 of the brake circuit 10 illustrated in FIG. 1. The conduit 870 corresponds to the supply conduit 20 in fluid communication with the boost valve 70. The conduit 872 corresponds to the conduit 36 in fluid communication with the wheel brake 22. The conduit 873 relates to the conduit 24 in fluid communication with the master cylinder 12. During normal boosted brake apply when the driver of the vehicle depresses the brake pedal 13, the pressure within the conduit 873 will normally be lower than the boosted pressure within the conduit 870, thereby biasing the plunger 877 rightward, as viewing FIG. 16. Rightward movement of the plunger 877 causes the ball 882 to seat against the valve seat 891, thereby restricting the flow of fluid from the conduit 873 to the conduit 872 via the bore 890 and the third radial passageway 868. Thus, the flow of fluid from the master cylinder 12 is prevented from flowing to the wheel brake 22. When the driver of the vehicle releases the brake pedal 13, the pressure within the conduit 866 typically falls below the pressure within the conduit 873, thereby biasing the ball 882 leftward, as viewing FIG. 16. Therefore, the ball 882 is lifted from the valve seat 891 permitting the flow of fluid from the conduit 872 to the conduit 873. Thus any residual pressure in the wheel brake 22 flows back into the master cylinder 12.

The radial passageway 884 formed in the plunger 877 provides for pressure balancing of the ball 882 so that the ball 882 is not urged into or out of the bore 878. Preferably, the third radial passageway 868 has a relatively small orifice (not shown) to help prevent a substantial amount of fluid from flowing through the isolation valve 850 before the ball 882 seats on the valve seat 891, especially during a sudden brake apply by the driver of the vehicle. Preferably, the diameter of the valve seat 891 is slightly smaller than the diameter across the seals 879 and 880 so that the poppet 876 is prevented from hydraulically locking into a closed position, wherein the pressure within the conduit 872 prevents the ball 882 from unseating. To enable the isolation valve 850 to open with a relatively small displacement of fluid, the maximum distance between the ball 882 and the valve seat 891 is preferably relatively small. Also, the frictional contact between the seals 879 and 880 and the surface of the axial bore 864 is preferably low. If the seal friction is low, a spring 892 having a relatively small spring force can be used to return the poppet 877 in a direction left-ward, as viewing FIG. 16.

Referring to FIG. 17, there is illustrated a first embodiment of a piloted pedal travel simulator shut-off valve, indicated generally at 900, which can be used as the pedal travel simulator shut-off valve 126 of the brake system 10 of FIG. 1. The pedal travel simulator shut-off valve 900 includes a housing 902 having a multi-stepped bore 904 formed therein. The housing 902 has four conduits, 906, 908, 910, and 912 formed therein which are in fluid communication with the bore 904. Slidably disposed within the bore 904 is a plunger 914. A pair of axially spaced elastomeric lip seals 916 and 918 are disposed about the plunger 914, and sealingly engaged with the wall of the housing 902 defining the bore 904 and engaged with the plunger 914. Preferably, the conduit 910 is in fluid communication with a fluid reservoir to provide means for detecting if one of the seals 916 or 918 fails and fluid leakage occurs past the failed seal. For example, as described with respect to the pedal travel simulator shut-off valve 126 of the brake system 10 of FIG. 1, if a leakage occurs past the seal 916, the motor 54 for the pump 52 will actuate an abnormally large amount of time to charge the high pressure accumulator 60. Fluid will leak past the seal 916 from the conduit 912 to the reservoir 14. Thus, the ECU 27 can be programmed to sense the abnormal running of the motor 54 and trigger an alert indicator of a possible malfunction. If a leakage occurred past the seal 918 and the brake system 10 was operating under a normal boosted braking operation, the driver may experience a drop in the brake pedal travel due to fluid leaking past the seal 918 from the pedal simulator 100 via the conduit 121 to the reservoir 14. Of course, the pair of seals 916 and 918 can be replaced with any suitable seal arrangement, such as a single O-ring and without the conduit 910 in fluid communication with the reservoir.

The plunger 914 is biased rightward, as viewing FIG. 17, by a spring 920 disposed in the bore 904 and acting between a shoulder 922 formed in the plunger 914 and a shoulder defined on the wall of the housing defining the bore 904. The plunger 914 further includes an extension pin 924 extending axially rightward, as viewing FIG. 17.

Disposed within the bore 904 of the housing 902 is an end plug 926 retained in the bore 904 by a circlip 928 and a wave spring 930. The end plug 926 is sealed to the wall of the bore 904 by an elastomeric seal 932. The end plug 926 has an axial bore 934 formed therein. A radial passageway 936 is formed through the end plug 926 and is in fluid communication with the axial bore 934 and the conduit 906. Fixably attached to the end plug 926 is a sleeve 938 having a through bore 940 formed therethrough. The sleeve 938 is sealingly engaged with the wall of the bore 904 by an elastomeric seal 942. A valve seat 944 is formed at the opening of one end of the through bore 940. A valve sealing member, such as a ball 946 is disposed in the axial bore 934 of the end plug 926. A spring 948 biases the ball 946 in a direction leftward against the valve seat 944. In the position shown in FIG. 17, the ball 946 is lifted from the valve seat 944 by the extension pin 924 of the plunger 914. Preferably, the sleeve 938 is fixably attached to the end plug 926 by a threaded connection so that the sleeve 938 can be easily positioned at a relatively close distance to the ball 946. An optional filter 950 can be disposed in the bore 934 in fluid communication between the conduits 906 and 908. Preferably, a notch 935 is formed in the end plug 926 to allow the fluid to flow around the ball 946 adjacent the end of the axial bore 934 so that the ball 946 can not remain trapped against the end of the axial bore 934.

The operation of the pedal travel simulator shut-off valve 900 shall now be described as being used as the pedal travel simulator shut-off valve 126 of the brake circuit 10 of FIG. 1. The conduit 906 relates to the conduit 25 in fluid communication with the master cylinder 12. The conduit 908 relates to the conduit 121 in fluid communication with the pedal travel simulator 100. The conduit 912 relates to the supply conduit 20 in fluid communication with the boost valve 70. During normal boosted brake apply when the driver of the vehicle depresses the brake pedal 13, the pressure within the conduit 906 will normally be lower than the pressure within the conduit 912, thereby biasing the plunger 914 rightward, as viewing FIG. 17. Rightward movement of the plunger 914 causes rightward movement of the extension pin 924 which lifts the ball 946 from the valve seat 944, as illustrated in FIG. 17. Thus, fluid is allowed to flow between the conduits 906 and 908, via the radial passageway 936, the axial bore 934 of the end plug 926, and the through bore 940 of the sleeve 938. When the driver of the vehicle releases the brake pedal 13, the pressure within the conduit 912 typically falls below the pressure within the conduit 906 and the conduit 908. The spring 920 will generally bias the extension pin 924 rightward to lift the ball 946 from the valve seat 944. Also, pressurized fluid is free to flow past the ball 946 and valve seat 944 in a direction from the conduit 908 to the conduit 906, thereby operating as the check valve 126 of the pedal travel simulator shutoff valve 124 of the brake system 10 of FIG. 1. Preferably, the spring force of the spring 948 is relatively small so that a small amount of pressure acting on the ball 946 will lift the ball from the valve seat 944.

The ball 946 will seat against the valve seat 944 when the pressure from the master cylinder 12 via the conduit 906 is higher than the pressure from the boost valve 70 by a predetermined pressure amount via the conduit 912. Thus, a relatively high volume of fluid is prevented from entering the pedal simulator is 100 so that the fluid can be used to actuate the wheel brakes.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A vehicle brake system comprising:

a wheel brake;

first and second conduits in fluid communication with said wheel brake;

a master cylinder having an outlet in fluid communication with said first conduit for supplying pressurized fluid to said first conduit;

a source of pressurized fluid being in fluid communication with said wheel brake via said second conduit;

a boost valve regulating the flow of fluid through said second conduit from said source of pressurized fluid to said wheel brake relative to the pressure at the outlet of said master cylinder by a predetermined boost ratio value, said boost valve being adapted to receive pressurized fluid from said first conduit for controlling the operation of said boost valve;

an isolation valve movable between a first position, wherein fluid is permitted to flow from said master cylinder to said wheel brake via said first conduit, and a second position, wherein fluid is prevented from flowing from said master cylinder to said wheel brake via said first conduit, said isolation valve being a pilot-operated valve movable between said first and second positions by a pressure differential between said outlet of said master cylinder and the pressure in said second conduit between said boost valve and said wheel brake;

a pedal simulator in fluid communication with said first conduit, said pedal simulator being adapted for storage of pressurized fluid.

2. The brake system of claim 1, wherein said boost valve is a pilot-operated valve responsive to pressure differential between said first and second conduits for regulating a supply pressure downstream of said boost valve.

3. The brake system of claim 1, wherein said boost valve has a solenoid, actuation of said solenoid operating said boost valve to regulate the flow of fluid through said second conduit from said source of pressurized fluid to said wheel brake.

4. The brake system of claim 1, wherein said boost valve includes a fluid reservoir in fluid communication with said source of pressurized fluid; and a spool valve movable between first, second, and third positions, wherein:

in said first position, said boost valve prevents the flow of fluid from said source of pressurized fluid to said wheel brake, and allows flow of fluid from said wheel brake to said fluid reservoir;

in said second position, said boost valve prevents flow of fluid from said source of pressurized fluid to said wheel brake, and prevents flow of fluid from said wheel brake to said fluid reservoir; and in said third position, said boost valve allows flow of fluid from said source of pressurized fluid to said wheel brake, and prevents the flow of fluid from said wheel brake to said fluid reservoir.

5. The brake system of claim 1, wherein said isolation valve includes:

a housing having a bore formed therein, said housing having third, fourth, and fifth conduits formed therein, said third conduit being in fluid communication with said boost valve, said fourth conduit being in fluid communication with said wheel brake, said fifth conduit being in fluid communication with said master cylinder;

a poppet slidably disposed in said bore of said housing, said poppet being movable between an open position, wherein said isolation valve is open, and a closed position, wherein said isolation valve is closed and fluid communication through said isolation valve from said fifth conduit to said fourth conduit is prevented, a first portion of said poppet being in fluid communication with said third conduit, pressurized fluid in said third conduit acting to urge said poppet toward said closed position, a second portion of said poppet being in fluid communication with said fifth conduit, pressurized fluid in said fifth conduit acting to urge said poppet toward said open position, such that said poppet is positioned in response to a difference in pressures between said third conduit and said fifth conduit.

6. The brake system of claim 1, wherein said master cylinder is in fluid communication a third conduit, said master cylinder being adapted to supply pressurized fluid to said third conduit, said pedal simulator including:

a housing having a wall defining a stepped bore having a closed end and an open end, said bore having first and second diameter portions, wherein said first diameter portion is smaller than said second diameter portion;

a stepped piston slidably disposed in said bore of said housing, said piston having first and second cylindrical portions, said first cylindrical portion having a smaller diameter than said second cylindrical portion;

a first seal sealingly engaging said first cylindrical portion of said piston and said wall of said first diameter portion of said bore, said first seal, said closed end of said bore, and said first diameter portion defining a first chamber in fluid communication with said first conduit;

a second seal sealingly engaging said second cylindrical portion of said piston and said wall of said second diameter portion of said bore, said bore, said first seal, said second seal, and said piston defining a second chamber in fluid communication with said third fluid conduit; and a spring biasing said piston so as to contract said first and said second chambers.

7. The brake system of claim 1, further including a pedal simulator valve movable between a first position, wherein fluid is permitted to flow from said master cylinder to said pedal simulator via said conduit, and a second position, wherein fluid is prevented from flowing from said master cylinder to said pedal simulator via said first conduit.

8. The brake system of claim 7, wherein said pedal simulator valve is a pilot-operated valve movable between said first and second positions by a pressure differential between said first and second conduits.

9. The brake system of claim 7, wherein said pedal simulator valve includes:

a housing having a bore formed therein, said housing having a valve seat formed adjacent said bore;

a ball cooperating with said valve seat to prevent fluid from flowing from said master cylinder to said pedal simulator when said ball is seated on said valve seat;

a spring biasing said ball against said valve seat; and a piston slidably disposed in said bore of said housing, said piston movable between a first position, wherein said piston engages said ball and lifts said ball from said valve seat when said pedal simulator valve is in said first position, and a second position, wherein said piston is not engaged with said ball so that said ball is permitted to seat against said valve seat when said pedal simulator valve is in said second position.

10. The brake system of claim 1 further including a boost enable valve movable between a first position, wherein fluid is prevented from flowing from said source of pressurized fluid to said boost valve via said second conduit, and a second position, wherein fluid is permitted to flow from said source of pressurized fluid to said boost valve via said second conduit.

11. The brake system of claim 10 further including a regulator valve disposed in said second conduit for maintaining a predetermined pressure in said second conduit between said boost valve and said source of pressurized fluid.

12. The brake system of claim 11, wherein said predetermined pressure is about 100 p.s.i.g.

13. The brake system of claim 11, wherein said regulator valve includes:

a housing having a bore formed therein, said housing having a valve seat formed in said housing;

a poppet slidably disposed in said bore of said housing, said poppet having a valve member for engaging said valve seat, said valve member and said valve seat cooperating to restrict the flow of flow of fluid from said source of pressurized fluid to said boost valve when said valve member is seated against said valve seat;

a spring biasing said valve member against said valve seat; and a piston slidably disposed is said bore of said housing, said piston having a pin extending therefrom in a direction towards said poppet, said poppet and said piston being movable relative to each other such that said poppet lifts said valve member from said valve seat when the pressure within said second conduit is less than said predetermined pressure, thereby permitting the flow of fluid from said source of pressurized fluid to enter said second conduit.

14. The brake system of claim 1, wherein said source of pressurized fluid includes:
   a hydraulic pump;
   a motor for operating said pump; and
   a first pressure accumulator in fluid communication with said pump and said boost valve for storage of pressurized fluid.

15. The brake system of claim 1 further including:
   a first source conduit providing fluid communication between a pump outlet and a first pressure accumulator;
   a first check valve having an inlet in fluid communication with said first source conduit and an outlet, said check valve preventing fluid from said outlet of said first check valve to said inlet of said first check valve;
   a second source conduit in fluid communication with said outlet of said first check valve;
   a second check valve having an inlet in fluid communication with said second source conduit and an outlet; said check valve preventing fluid flow from said outlet of said second check valve to said inlet of said second check valve;
   a third fluid conduit in fluid communication with said outlet of said second check valve;
   a second accumulator in fluid communication with said outlet of said second check valve;
   a first regulator valve having an inlet in fluid communication with said outlet of said second check valve and said second accumulator, and an outlet in fluid communication with said second source conduit;
   a second regulator valve having an inlet in fluid communication with said outlet of said first regulator valve and said second source conduit and having an outlet; and
   a boost enable valve having an inlet in fluid communication with said second regulator valve and a valve outlet in fluid communication with said boost valve.

16. The brake system of claim 1, further including:
   an apply valve for regulating fluid pressure between said boost valve and said wheel brake via said second conduit; and
   a dump valve for regulating fluid pressure between said boost valve and a fluid reservoir.

* * * * *

UNITED STATES PATENT AND TRADEMARK OFFICE
CERTIFICATE OF CORRECTION

PATENT NO. : 6,206,484 B1
DATED : March 27, 2001
INVENTOR(S) : Blaise J. Ganzel

It is certified that error appears in the above-identified patent and that said Letters Patent is hereby corrected as shown below:

<u>Claim 6,</u>
<u>Column 34,</u>
Line 6, after the word "said" insert -- first --.

Signed and Sealed this

Twenty-first Day of August, 2001

*Attest:*

*Attesting Officer*

NICHOLAS P. GODICI
*Acting Director of the United States Patent and Trademark Office*